US009006024B2

(12) United States Patent
Akimoto

(10) Patent No.: US 9,006,024 B2
(45) Date of Patent: Apr. 14, 2015

(54) METHOD FOR MANUFACTURING SEMICONDUCTOR DEVICE

(71) Applicant: Semiconductor Energy Laboratory Co., Ltd., Atsugi (JP)

(72) Inventor: Kengo Akimoto, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 50 days.

(21) Appl. No.: 13/865,344

(22) Filed: Apr. 18, 2013

(65) Prior Publication Data

US 2013/0288426 A1    Oct. 31, 2013

(30) Foreign Application Priority Data

Apr. 25, 2012    (JP) .................................. 2012-099653

(51) Int. Cl.
*H01L 27/12*    (2006.01)
*H01L 21/34*    (2006.01)
(Continued)

(52) U.S. Cl.
CPC ........ *H01L 29/66765* (2013.01); *H01L 27/127* (2013.01); *H01L 29/7869* (2013.01);
(Continued)

(58) Field of Classification Search
CPC ................... H01L 29/78696; H01L 29/66765; H01L 29/786; H01L 29/7869; H01L 27/2151; H01L 27/1225; H01L 27/1156; H01L 27/11807
USPC ........................................................ 438/104
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Olik Chaudhuri
*Assistant Examiner* — Christine Enad
(74) *Attorney, Agent, or Firm* — Fish & Richardson P.C.

(57) ABSTRACT

In a semiconductor device in which transistors are formed in a plurality of layers to form a stack structure, a method for manufacturing the semiconductor device formed by controlling the threshold voltage of the transistors formed in the layers selectively is provided. Further, a method for manufacturing the semiconductor device by which oxygen supplying treatment is effectively performed is provided. First oxygen supplying treatment is performed on a first oxide semiconductor film including a first channel formation region of a transistor in the lower layer. Then, an interlayer insulating film including an opening which is formed so that the first channel formation region is exposed is formed over the first oxide semiconductor film and second oxygen supplying treatment is performed on a second oxide semiconductor film including a second channel formation region over the interlayer insulating film and the exposed first channel formation region.

21 Claims, 15 Drawing Sheets

(51) Int. Cl.
*H01L 29/66* (2006.01)
*H01L 29/786* (2006.01)
*H01L 27/115* (2006.01)
*H01L 27/118* (2006.01)

(52) U.S. Cl.
CPC ........ *H01L27/1225* (2013.01); *H01L 27/1251* (2013.01); *H01L 27/1156* (2013.01); *H01L 27/11807* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,129,719 B2 | 3/2012 | Yamazaki et al. |
| 8,421,081 B2* | 4/2013 | Kato et al. .................. 257/59 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0003429 A1 | 1/2011 | Oikawa et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2012/0064703 A1* | 3/2012 | Jintyou et al. ................. 438/482 |
| 2012/0122277 A1 | 5/2012 | Yamazaki et al. |
| 2012/0161127 A1* | 6/2012 | Kato et al. .................. 257/43 |
| 2013/0140569 A1 | 6/2013 | Yoneda et al. |
| 2013/0153890 A1 | 6/2013 | Yoneda |
| 2013/0161607 A1 | 6/2013 | Yoneda et al. |
| 2013/0161713 A1 | 6/2013 | Yamazaki et al. |
| 2013/0258746 A1 | 10/2013 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

(56) References Cited

OTHER PUBLICATIONS

Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven By the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDUM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3-A2O3-BP Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IgZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

METHOD FOR MANUFACTURING SEMICONDUCTOR DEVICE

BACKGROUND OF THE INVENTION

1. Field of the Invention

The present invention relates to a method for manufacturing a semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

A technique by which a transistor (also referred to as a thin film transistor (TFT)) is formed using a semiconductor film formed over a substrate as a channel formation region has attracted attention. The transistor is applied to a wide range of electronic devices such as an integrated circuit (IC) or an image display device (display device). A silicon-based semiconductor material is widely known as a material for a semiconductor film applicable to a transistor. As another material, an oxide semiconductor has been attracting attention.

For example, a transistor including a semiconductor film formed using an amorphous oxide containing indium (In), gallium (Ga), and zinc (Zn) (In—Ga—Zn—O-based amorphous oxide) is disclosed (see Patent Document 1).

When such transistors each including an oxide semiconductor are stacked to have a three-dimensional layered structure, a complex circuit configuration can be formed in a small area. Further, by combination of an integrated circuit formed using a stack of such transistors each including an oxide semiconductor and a transistor which has high field effect mobility and formed using a single crystal silicon substrate, a higher functional circuit can be obtained.

REFERENCE

[Patent Document 1] Japanese Published Patent Application No. 2011-181801

SUMMARY OF THE INVENTION

However, oxygen vacancies in an oxide semiconductor serve as donors to generate electrons that are carriers in the oxide semiconductor. Many oxygen vacancies in an oxide semiconductor including a channel formation region of a transistor lead to generation of electrons in the channel formation region, which causes a shift of the threshold voltage of the transistor in the negative direction.

In view of the foregoing, oxygen supplying treatment such as oxygen annealing treatment or oxygen doping treatment is performed on an oxide semiconductor, whereby oxygen vacancies are reduced and the threshold voltage of a transistor in which an oxide semiconductor is used for a channel formation region can be shifted in a positive direction.

However, the oxygen supplying treatment such as oxygen annealing treatment or oxygen doping treatment needs to be performed on each oxide semiconductor film under an optimum condition. In particular, in the case where transistors in each of which an oxide semiconductor is used for a channel formation region are formed in different layers to have a stacked structure, the threshold voltage of the transistors in each of which an oxide semiconductor film is used depends on the oxide semiconductor film formed in each layers.

Further, since it takes much time to perform the oxygen supplying treatment such as oxygen annealing treatment or oxygen doping treatment, in the case where transistors in each of which an oxide semiconductor is used for a channel formation region are formed in different layers to have a stacked structure, longer time is needed and it is not preferable in terms of throughput.

In view of the above, it is an object to provide a method for manufacturing a semiconductor device by controlling the threshold voltage of transistors formed in a plurality of layers selectively, in the semiconductor device in which the transistors in each of which an oxide semiconductor is used for a channel formation region are formed in the layers to form a stack structure.

Further, it is an object to provide a method for manufacturing a semiconductor device by which oxygen supplying treatment is effectively performed, in the semiconductor device in which transistors in each of which an oxide semiconductor is used for a channel formation region are formed in a plurality of layers to form a stack structure.

In one embodiment of the present invention disclosed in this specification, transistors including oxide semiconductor films are formed in different layers to form a stacked-layer structure. In the method for forming a semiconductor device, in formation of the stacked-layer structure, oxygen supplying treatment is performed on oxide semiconductor films of transistors in at least two vertically adjacent layers at the same time.

The oxygen supplying treatment is performed on at least a region serving as a channel formation region of a transistor. In order to perform the oxygen supplying treatment on the oxide semiconductor films formed in different layers at the same time, an opening is formed in advance by partial removal of an insulating film above a region serving as a channel formation region of the oxide semiconductor film formed in the lower layer. The opening may be formed to reach a surface of the oxide semiconductor film or may be formed in such a manner that the insulating film with a certain thickness that allows the oxygen supplying treatment is left over the surface of the oxide semiconductor film.

One embodiment of the present invention disclosed in this specification is a method for manufacturing a semiconductor device, including the steps of forming a first gate electrode layer; forming a first gate insulating film over the first gate electrode layer; forming a first oxide semiconductor film including a first channel formation region over the first gate insulating film; performing first oxygen supplying treatment on the first oxide semiconductor film; forming a first source electrode layer and a first drain electrode layer electrically connected to the first oxide semiconductor film over the first oxide semiconductor film; forming an interlayer insulating film over the first source electrode layer and the first drain electrode layer; forming a second oxide semiconductor film including a second channel formation region over the interlayer insulating film; forming an opening in part of the interlayer insulating film so that the first channel formation region is exposed; performing second oxygen supplying treatment on the second oxide semiconductor film and the exposed first channel formation region of the first oxide semiconductor film in the opening; forming a second source electrode layer and a second drain electrode layer electrically connected to the second oxide semiconductor film over the second oxide semiconductor film; forming a second gate insulating film over the second source electrode layer, the second drain electrode layer, and the second oxide semiconductor film; and forming a second gate electrode layer over the second gate insulating film.

One embodiment of the present invention is a method for manufacturing a semiconductor device in which oxygen doping treatment or the oxygen doping treatment and oxygen annealing treatment is performed as the oxygen supplying treatment.

One embodiment of the present invention is a method for manufacturing a semiconductor device in which an ion implantation method is used as the oxygen doping treatment. In the case of using the ion implantation method, the oxygen doping treatment can be performed with a dose of oxygen greater than or equal to $0.5 \times 10^{15}$ cm$^{-2}$ and less than or equal to $5 \times 10^{16}$ cm$^{-2}$ at acceleration voltage higher than or equal to 5 kV and lower than or equal to 20 kV.

Note that the "oxygen doping" means that oxygen (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for oxygen doping treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen doping treatment.

By the condition of the oxygen doping treatment, not only a film directly exposed to the oxygen doping treatment but also a film provided below the film can be doped with oxygen.

The first oxygen supplying treatment is treatment performed on the oxide semiconductor film included in the first transistor and then the oxide semiconductor film included in the first transistor is subjected to second oxygen supplying treatment together with the oxide semiconductor film included in the second transistor. Therefore, the first oxygen supplying treatment is also, so to speak, preliminary treatment on the oxide semiconductor film included in the first transistor; the oxygen supplying treatment on the oxide semiconductor included in the first transistor is finally completed through the second oxygen supplying treatment (but, oxygen supplying treatment may be further performed after the second oxygen supplying treatment).

Through the second oxygen supplying treatment performed later, oxygen vacancies in the oxide semiconductor film included in the second transistor are sufficiently reduced, whereby the threshold voltage of the second transistor is shifted in a positive direction to make the second transistor normally off. Therefore, in the first oxygen supplying treatment, oxygen whose amount is insufficient for reducing oxygen vacancies in the oxide semiconductor film in the second oxygen supplying treatment is adjusted in advance and introduced.

Therefore, from the amount of oxygen released depending on the structures, the shapes, the materials, and the like and the manufacturing processes of the first transistor and the second transistor, the amount of oxygen necessary for introduction is calculated in advance, whereby the amount of oxygen introduced at the time of the first oxygen supplying treatment is adjusted and the first oxygen supplying treatment can be performed under an optimum condition.

In this manner, the first transistor and the second transistor can be formed by controlling the threshold voltage of the first transistor and the second transistor formed in each layer selectively.

One embodiment of the present invention is a method for manufacturing a semiconductor device in which in the above structure, planarization treatment is performed on a surface of the interlayer insulating film by a chemical mechanical polishing method.

Further, a back gate electrode layer that controls electrical characteristics of a transistor including an oxide semiconductor film can be additionally formed. For example, when the potential of the back gate electrode layer is GND, the threshold voltage of the transistor can be shifted in a positive direction and thus, the transistor can serve as a normally-off transistor. In addition, the back gate electrode layer has a function of blocking an external electric field, that is, a function of preventing the external electric field (particularly, a function of blocking static electricity) from affecting the transistor. A blocking function of the back gate electrode layer can prevent the variation in the electric characteristics of the transistor due to the effect of external electric field such as static electricity.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed in an oxide semiconductor film or a semiconductor device including a circuit which is formed using such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

In a semiconductor device in which transistors in each of which an oxide semiconductor is used for a channel formation region are formed in a plurality of layers to form a stack structure, a method for manufacturing the semiconductor device formed by controlling the threshold voltage of the transistors formed in the layers selectively can be provided.

In a semiconductor device in which transistors in each of which an oxide semiconductor is used for a channel formation region are formed in a plurality of layers to form a stack structure, a method for manufacturing the semiconductor device by which oxygen supplying treatment is effectively performed can be provided.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments.

Note that the ordinal numbers such as "first" and "second" in this specification are used for convenience and do not denote the order of steps and the stacking order of layers. In addition, the ordinal numbers in this specification do not denote particular names which specify the present invention.

Note that in this specification and the like, the term "electrically connected" includes the case where components are connected through an "object having any electric function". There is no particular limitation on the object having any electric function as long as electric signals can be transmitted and received between the components connected through the object. Examples of an "object having any electric function" are a switching element such as a transistor, a resistor, an inductor, a capacitor, and an element with a variety of functions as well as an electrode and a wiring.

Embodiment 1

In this embodiment, one embodiment of a semiconductor device is described with reference to FIGS. 1A and 1B and FIG. 2. In this embodiment, an example of a semiconductor device including a transistor in which an oxide semiconductor is used for a channel formation region is described.

Figure 1A:
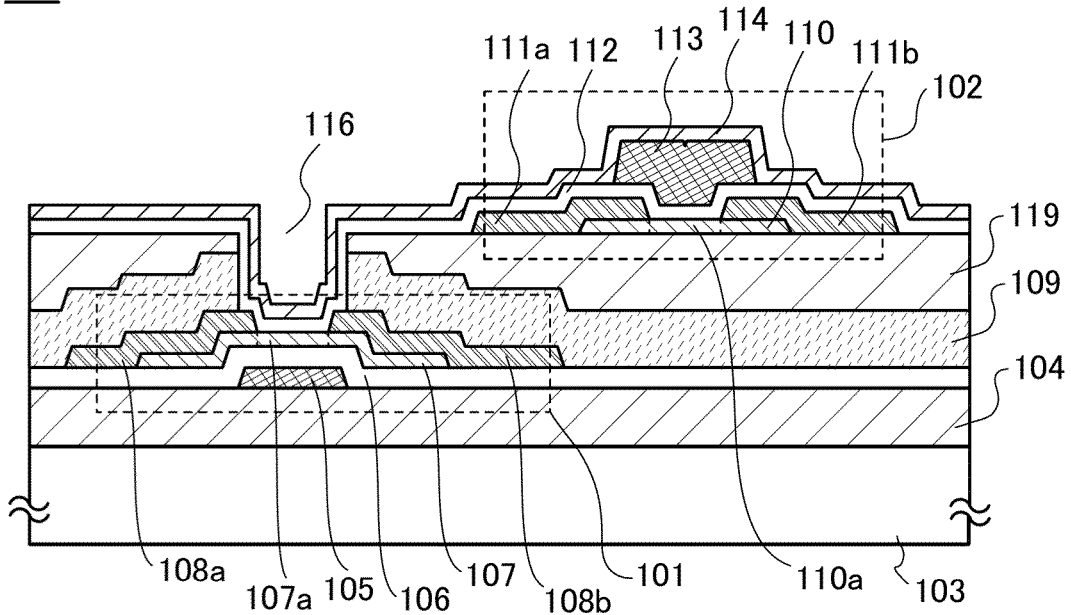
FIGS. 1A and 1B are cross-sectional views each illustrating one embodiment of a semiconductor device.

FIG. 1A illustrates a semiconductor device 100 in which a first transistor and a second transistor are provided in different layers. That is, the first transistor and the second transistor are stacked in a height direction, so that a three-dimensional stacked structure is formed. Accordingly, a plurality of transistors can be integrated to have a high density. Note that in FIG. 1A, one first transistor and one second transistor are schematically illustrated; however, a plurality of first transistors is provided in the layer where the first transistor is provided (hereinafter referred to as the lower layer) and a plurality of second transistors is provided in the layer where the second transistor is provided (hereinafter referred to as the upper layer). An electric circuit is formed in the lower layer by the plurality of first transistors and an electric circuit is formed in the upper layer by the plurality of second transistors. Further, the electric circuit formed in the lower layer and the electric circuit formed in the upper layer are electrically connected to each other as appropriate, whereby the electric circuits in the layers are functionally combined with each other to form a three-dimensional integrated electric circuit.

Note that in this embodiment, a two-layer structure of the lower layer and the upper layer is described; however, the number of layers may be greater than or equal to three within the allowable range of the manufacturing process.

Further, the transistor used in this embodiment may have a single gate structure, in which one channel formation region is formed, a double gate structure, in which two channel formation region are formed, or a triple gate structure, in which three channel formation regions are formed.

As an example of a stack of transistors, an example in which a first transistor 101 positioned in the lower layer is a bottom-gate transistor and a second transistor 102 positioned above the first transistor is a top-gate transistor is illustrated in FIG. 1A.

As illustrated in FIG. 1A, the bottom-gate first transistor 101 is provided over a substrate 103 and a base insulating film 104. A gate electrode layer 105 is stacked over the base insulating film 104, a gate insulating film 106 is stacked over the gate electrode layer 105, and an oxide semiconductor film 107 is stacked over the gate insulating film 106.

Further, a source electrode layer 108a and a drain electrode layer 108b are electrically connected to the oxide semiconductor film 107. The source electrode layer 108a and the drain electrode layer 108b are in direct contact with part of side surfaces and part of a top surface of the oxide semiconductor film 107, whereby electrical connection is performed. Note that the source electrode layer 108a and the drain electrode layer 108b are a pair of electrode layers serving as a source and a drain depending on a configuration of a circuit that is arranged, and the source and the drain may be interchanged with each other over time.

An interlayer insulating film 109 covering the first transistor 101 is provided over the first transistor 101. Further, a base insulating film 119 serving as a base of the second transistor 102 is provided over the interlayer insulating film 109. As illustrated in FIG. 1A, a top surface of the base insulating film 119 is preferably flat. The base insulating film 119 has a flat top surface, whereby an element or a wiring which is formed over the base insulating film 119 can be formed at high precision and high density.

The second transistor 102 is provided over the base insulating film 119. In the top-gate second transistor 102, an oxide semiconductor film 110 is stacked over the base insulating film 119, a gate insulating film 112 is stacked over the oxide semiconductor film 110, and a gate electrode layer 113 is stacked over the gate insulating film 112. Further, the source electrode layer 111a and the drain electrode layer 111b are in direct contact with part of side surfaces and part of a top surface of the oxide semiconductor film 110, whereby electrical connection is performed.

Furthermore, a protective insulating film 114 is provided so as to cover the second transistor 102.

As described above, in the semiconductor device according to this embodiment, the plurality of transistors is positioned in different layers. Here, the oxide semiconductor film 107 included in the first transistor 101 includes a channel formation region 107a and the oxide semiconductor film 110 included in the second transistor 102 includes a channel formation region 110a. As illustrated in FIG. 1A, in the semiconductor device 100 according to this embodiment, the channel formation region 107a of the first transistor 101 and the channel formation region 110a of the second transistor 102 are formed so as not to overlap with each other. As described above, the semiconductor films in the upper layer and the lower layer are positioned so that the channel formation regions do not overlap with each other, whereby the channel formation region 107a and the channel formation region 110a that are positioned in different layers can be exposed on an outermost surface at the same time. With such an arrangement, oxygen supplying treatment described later can be performed on the semiconductor films formed in different layers at the same time.

Further, in order to perform the same oxygen supplying treatment on the semiconductor films formed in different layers, an opening 116 in the interlayer insulating film 109 and the base insulating film 119 is provided over the channel formation region 107a of the oxide semiconductor film 107 positioned in the lower layer. With the opening 116, when the oxide semiconductor film 110 positioned in the upper layer is exposed on an outermost surface, the channel formation region 107a of the oxide semiconductor film 107 positioned in the lower layer is also exposed; therefore, the same oxygen supplying treatment can be performed.

Note that in this embodiment, the first transistor 101 and the second transistor 102 may be provided so as to partly overlap with each other as long as the channel formation regions of the transistors do not overlap with each other. In addition, the semiconductor films may partly overlap with each other as long as the channel formation regions do not overlap with each other. When the channel formation regions do not overlap with each other and the transistors are positioned so as to partly overlap with each other, limitation of layout design between the upper and lower layers is reduced and a high-density circuit layout can be made.

In FIG. 1A, the base insulating film 104 is illustrated; however, it may be formed as needed and can be omitted. As the base insulating film 104, for example, an oxide insulating film can be formed. The oxide insulating film contains oxygen in excess of that in the stoichiometric composition, whereby the oxide insulating film prevents elimination of oxygen from the oxide semiconductor film 107 and effectively serves as an oxygen supplying layer which supplies oxygen to the oxide semiconductor film 107.

Further, although not shown, a barrier film (protective film) which prevents elimination of oxygen may be provided between the base insulating film 104 and the substrate 103. The barrier film may be a single layer or a stacked layer, and for example, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium zinc oxide film, or a zinc oxide film can be used. An insulating film serving as the barrier film can be formed by a plasma CVD method, a sputtering method, or a CVD method using a deposition gas. As the insulating film serving as the barrier film, a film containing an aluminum oxide film can be preferably used. Further, a stacked film in which a titanium oxide film, a nickel oxide film, a molybdenum oxide film, or a tungsten oxide film is stacked under or on the aluminum oxide film may be provided as the barrier film. The aluminum oxide film has a superior shielding effect (blocking effect), which is not permeable to either oxygen or impurities such as hydrogen or moisture. Therefore, when the aluminum oxide film is provided as the barrier film, in and after the manufacturing process, the aluminum oxide film can favorably serve as a protective layer that prevents entry of an impurity such as hydrogen or moisture, which causes a change, into the base insulating film 104, the gate insulating film 106, or the oxide semiconductor film 107 and elimination of oxygen from the base insulating film 104, the gate insulating film 106, or the oxide semiconductor film 107.

An oxide semiconductor used for each of the oxide semiconductor film 107 and the oxide semiconductor film 110 preferably contains at least indium (In). In particular, In and zinc (Zn) are preferably contained. The oxide semiconductor preferably contains, in addition to In and Zn, gallium (Ga) serving as a stabilizer that reduces variations in electrical characteristics among transistors including the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Alternatively, a material represented by $InMO_3(ZnO)_n$, (m>0 is satisfied, and m is not an integer) may be used as the oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed electrical characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, with an In—Sn—Zn-based oxide, high mobility can be realized relatively easily. However, mobility can be increased by reducing the defect density in a bulk also in the case of using an In—Ga—Zn-based oxide.

Note that for example, the expression "the composition of an oxide containing In, Ga, and Zn at an atomic ratio of In:Ga:Zn=a:b:c (a+b+c=1), is in the neighborhood of the composition of an oxide containing In, Ga, and Zn at an atomic ratio of In:Ga:Zn=A:B:C (A+B+C=1)" means that a, b, and c satisfy the following relation: $(a-A)^2+(b-B)^2+(c-C)^2 \le r^2$. For example, r may be 0.05. The same applies to other oxides.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with a InGaZnO$_4$ crystal is analyzed by an out-of-plane method, a peak of 2θ may also be observed at around 36°, in addition to the peak of 2θ at around 31°. The peak of 2θ at around 36° is derived from the (311) plane of a ZnGa$_2$O$_4$ crystal; such a peak indicates that a ZnGa$_2$O$_4$ crystal is included in part of the CAAC-OS film including the InGaZnO$_4$ crystal. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that $R_a$ is obtained by expanding arithmetic mean deviation, which is defined by JIS B 0601, into three dimensions so as to be applicable to a surface. Moreover, $R_a$ can be expressed as average value of the absolute values of deviations from a reference surface to a specific surface and is defined by the following formula.

$$Ra = \frac{1}{S_0}\int_{y_1}^{y_2}\int_{x_1}^{x_2}|f(x,y) - Z_0|dxdy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Further, $S_0$ represents the area of a rectangle which is obtained by projecting the specific surface on the x-y plane, and $Z_0$ represents the height of the reference surface (the average height of the specific surface). Note that $R_a$ can be measured using an atomic force microscope (AFM).

Each of the oxide semiconductor film 107 and the oxide semiconductor film 110 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film 107 and the oxide semiconductor film 110 may each be formed using a sputtering apparatus which performs film formation with surfaces of a plurality of substrates set substantially perpendicular to a surface of a sputtering target.

Note that each of the oxide semiconductor film 107 and the oxide semiconductor film 110 may have a structure in which a plurality of oxide semiconductor films are stacked. For example, each of the oxide semiconductor film 107 and the oxide semiconductor film 110 may be a stacked layer using metal oxides with different compositions. For example, a stacked layer of a three-component metal oxide and a two-component metal oxide may be used. Alternatively, a stacked layer of three-component metal oxides may be used.

Further, in each of the oxide semiconductor film 107 and the oxide semiconductor film 110, the constituent elements of the stacked oxide semiconductor films may be the same as each other but the composition of the constituent elements of the stacked oxide semiconductor films may be different from each other. For example, each of the oxide semiconductor film 107 and the oxide semiconductor film 110 may have a stack of an oxide semiconductor film with an atomic ratio of In:Ga:Zn=1:1:1 and an oxide semiconductor film with an atomic ratio of In:Ga:Zn=3:1:2. Alternatively, each of the oxide semiconductor film 107 and the oxide semiconductor film 110 may have a stack of an oxide semiconductor film with an atomic ratio of In:Ga:Zn=1:3:2 and an oxide semiconductor film with an atomic ratio of In:Ga:Zn=2:1:3.

Further, in each of the oxide semiconductor film 107 and the oxide semiconductor film 110, the stacked oxide semiconductor films may be formed using oxide semiconductors having different crystallinity. That is, an appropriate combination of any of a single crystal oxide semiconductor, a polycrystalline oxide semiconductor, an amorphous oxide semiconductor, and a CAAC-OS may be employed. An amorphous oxide semiconductor is applied to at least one of the stacked oxide semiconductor films, so that internal stress or external stress of the oxide semiconductor film 107 and the oxide semiconductor film 110 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor film on the channel side is preferably formed using a crystalline oxide semiconductor such as a CAAC-OS.

Further, each of the oxide semiconductor film 107 and the oxide semiconductor film 110 may have a stacked-layer structure including three or more layers in which an amorphous oxide semiconductor film is interposed between a plurality of oxide semiconductor films having crystallinity. Furthermore, a structure in which an oxide semiconductor film having a crystallinity and an amorphous oxide semiconductor film are alternately stacked may be employed.

The above structures used when each of the oxide semiconductor film 107 and the oxide semiconductor film 110 has a stacked-layer structure of a plurality of layers can be employed in combination as appropriate.

As described above, for the oxide semiconductor film 107 included in the first transistor 101 and the oxide semiconductor film 110 included in the second transistor 102, a variety of structures can be formed by a combination of a material, crystallinity, a stacked-layer structure, and the like. Therefore, the transistors are formed to have a stacked-layer structure, whereby the oxide semiconductor film 107 and the oxide semiconductor film 110 can have different structures as appropriate in accordance with the purpose of forming a circuit in many layers. On the other hand, since the threshold voltage of each of the first transistor 101 and the second transistor 102 is selectively controlled; therefore, it is also effective to use the oxide semiconductor film having the same structure.

Figure 1B:
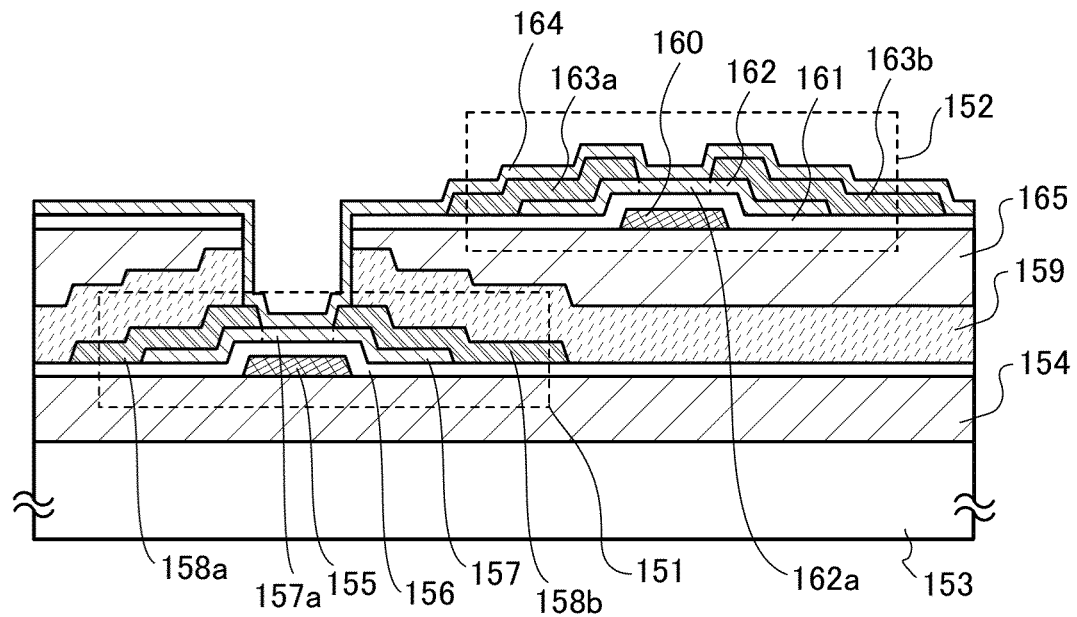

FIG. 1B is a schematic view illustrating an example of a semiconductor device 150 in which a first transistor 151 and a second transistor 152 are bottom-gate transistors.

The first transistor 151 is formed over a substrate 153 and a base insulating film 154 and has a structure in which a gate electrode layer 155, a gate insulating film 156, and an oxide semiconductor film 157 are stacked in this order. A source electrode layer 158a and a drain electrode layer 158b are provided in contact with part of side surfaces and part of a top surface of the oxide semiconductor film 157, whereby electrical connection is performed.

The second transistor 152 is provided over an interlayer insulating film 159 covering the first transistor 151 and a base insulating film 165. The base insulating film 165 has a flat surface like the base insulating film 119. The second transistor 152 has a structure in which a gate electrode layer 160, a gate insulating film 161, and an oxide semiconductor film 162 are stacked in this order like the first transistor 151. A source electrode layer 163a and a drain electrode layer 163b are provided in contact with part of side surfaces and part of a top surface of the oxide semiconductor film 162, whereby electrical connection is performed. Further, a protective insulating film 164 is provided over the source electrode layer 163a and the drain electrode layer 163b.

The semiconductor device having a layered structure illustrated in FIG. 1B is similar to the semiconductor device illustrated in FIG. 1A except that the second transistor 152 is a bottom-gate transistor.

In particular, the first transistor 151 and the second transistor 152 that are bottom-gate transistors have substantially the same structure and shape, whereby the threshold voltage can be easily controlled. In the case where the first transistor 151 and the second transistor 152 have substantially the same threshold voltage, a semiconductor device having a plurality of layers can be easily designed. In order to control the threshold voltage as described below, it is important that the materials for forming the transistors, the film thicknesses, and the channel lengths and the channel widths of the channel formation regions are the same.

Next, an example of a semiconductor device 200 including a back gate electrode layer that controls electrical characteristics of the transistor in each layer is described with reference to FIG. 2.

The semiconductor device 200 has a layered structure in which a bottom-gate first transistor 201 is included in the lower layer and a top-gate second transistor 202 is included in the upper layer, like the semiconductor device 100 illustrated in FIG. 1A. The first transistor 201 is provided over a base insulating film 204 provided over a substrate 203 and the second transistor 202 is provided over a base insulating film 211 provided over an interlayer insulating film 209. In the first transistor 201, an oxide semiconductor film 207 is provided over a gate electrode layer 205 with a gate insulating film 206 interposed therebetween and a source electrode layer 208a and a drain electrode layer 208b are provided in contact with part of a top surface and part of side surfaces of the oxide semiconductor film 207. In the second transistor 202, a source electrode layer 213a and a drain electrode layer 213b are provided in contact with part of a top surface and part of side surfaces of an oxide semiconductor film 212, and a gate electrode layer 215 is provided over a gate insulating film 214 provided over the source electrode layer 213a and the drain electrode layer 213b. Further, a protective insulating film 217 is provided so as to cover the gate insulating film 214 and the gate electrode layer 215. Here, a back gate electrode layer is provided for each transistor. That is, in the first transistor 201, a back gate electrode layer 216 is provided to face the gate electrode layer 205 with the oxide semiconductor film 207 interposed therebetween. Further, in the second transistor 202, a back gate electrode layer 210 is provided to face the gate electrode layer 215 with the oxide semiconductor film 212 interposed therebetween.

For example, the potential of the back gate electrode layer 216 is GND or a fixed potential that is lower than GND, whereby the threshold voltage of the first transistor 201 can be shifted in a positive direction and thus, the transistor can serve as a normally-off transistor. Similarly, the potential of the back gate electrode layer 210 is GND or a fixed potential that is lower than GND, whereby the threshold voltage of the second transistor 202 can be shifted in a positive direction and thus, the transistor can serve as a normally-off transistor.

Further, each of the back gate electrode layers has a function of blocking an external electric field. Therefore, the action of external electric field (in particular, the action of static electricity) on the first transistor 201 or the second transistor 202 can be blocked. As described above, the blocking function of each of the back gate electrode layers can prevent a change in electric characteristics of the first transistor 201 or the second transistor 202 due to the effect of external electric field such as static electricity.

Each of the back gate electrode layers can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as each of the back gate electrode layers. Each of the back gate electrode layers may have a single-layer structure or a stacked-layer structure.

Each of the back gate electrode layers can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that each of the back gate electrode layers has a stacked structure of the above conductive material and the above metal material.

Figure 2:
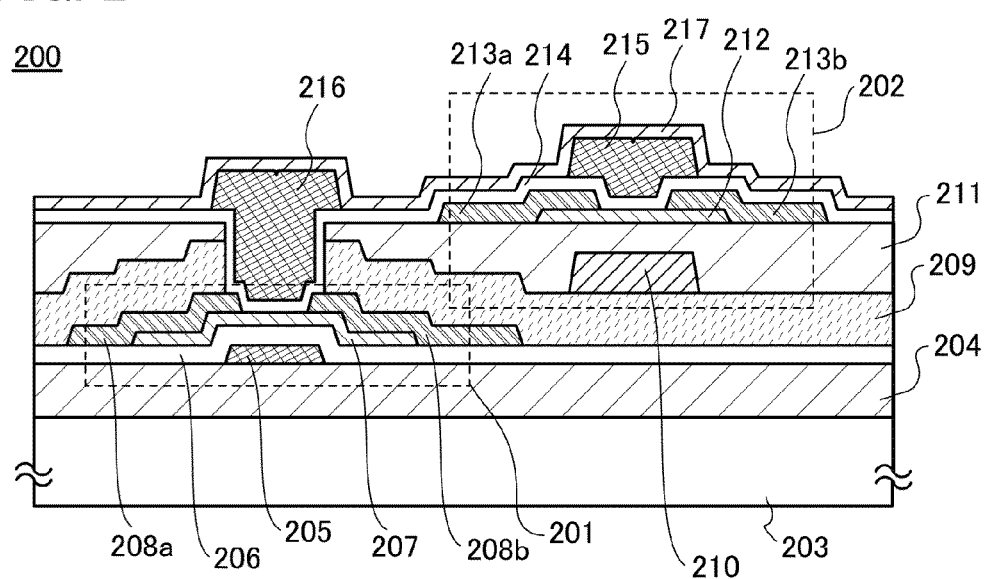
FIG. 2 is a cross-sectional view illustrating one embodiment of a semiconductor device.

In the semiconductor device 200 illustrated in FIG. 2, the back gate electrode layer 216 of the first transistor 201 and the gate electrode layer 215 of the second transistor 202 are formed using the same wiring material. In the case where the back gate electrode layer is formed in such a manner, the back gate electrode layer is formed at the same time as another layer using a conductive material, whereby the number of manufacturing steps can be reduced or shortening of the manufacturing process can be achieved.

Note that the back gate electrode layer serves as a common electrode layer in which electrical connection is performed in each layer and whose fixed potential differs in each layer, whereby the threshold voltage of transistors in each layer can be controlled. Alternatively, all of the back gate electrode layers of the transistors in the layers are electrically connected to each other and are in common, whereby the potentials of the back gate electrodes in all of the layers can be controlled to the same potential.

The above-described semiconductor device having a layered structure in which transistors are included in different layers can be formed by a manufacturing method described later.

Note that in each of the semiconductor devices each having a layered structure shown with reference to FIGS. 1A and 1B and FIG. 2, a connection structure of the first transistor positioned in the lower layer and the second transistor positioned in the upper layer is not described here. The electrical connection between the first transistor and the second transistor can be performed as appropriate depending on a circuit configuration to realize a predetermined function.

Figure 6A:
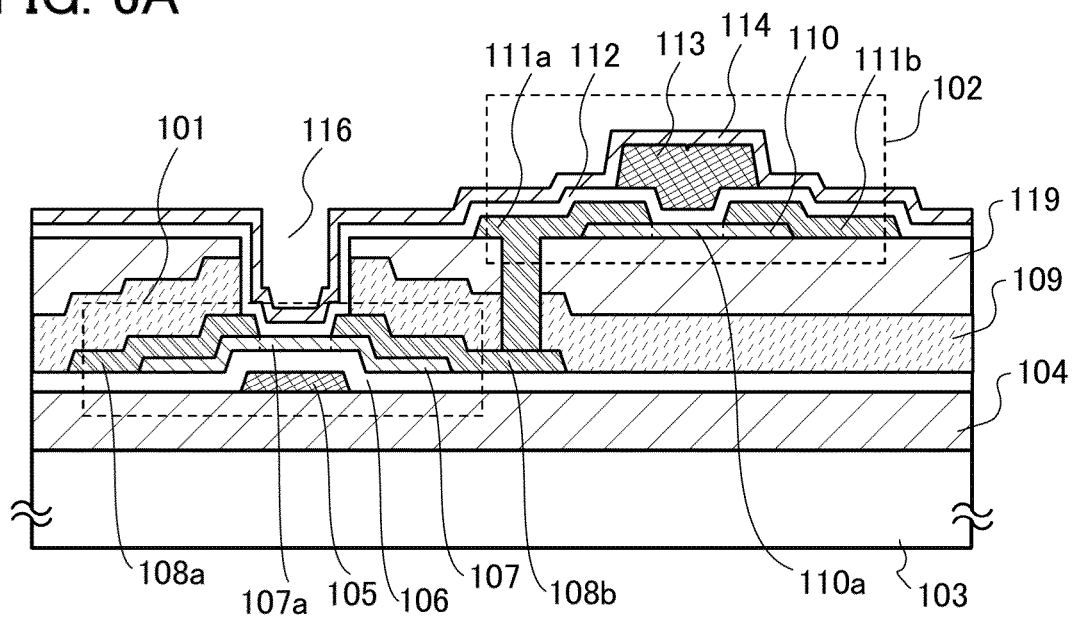
FIGS. 6A and 6B are cross-sectional views illustrating one embodiment of a semiconductor device.

In other words, the gate electrode layer, the source electrode layer, and the drain electrode layer of the first transistor that is a three-terminal element can be electrically connected to at least one of the gate electrode layer, the source electrode layer, and the drain electrode layer of the second transistor that is also a three-terminal element like the first transistor. In this case, an opening is formed in the interlayer insulating film 109, the base insulating film 119, and the like between the first transistor and the second transistor, whereby the electrode layer of the second transistor may be in contact with the electrode layer of the first transistor (see FIG. 6A) or the opening may be filled with a conductor such as a contact plug 118, so that the electrical connection is performed (see FIG. 6B).

Figure 6B:
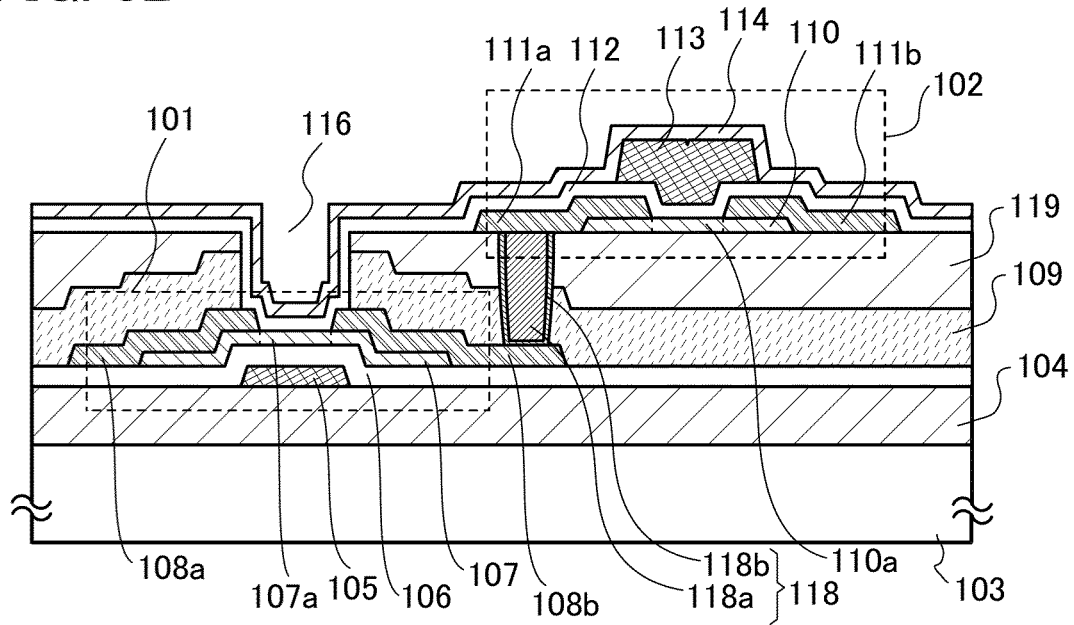

In FIG. 6B, as an example in which the drain electrode layer 108b of the first transistor 101 and the source electrode layer 111a of the second transistor 102 are electrically connected to each other, the contact plug 118 is provided in the interlayer insulating film 109 and the base insulating film 119. The contact plug 118 includes a portion 118a mainly serving as a wiring formed using a conductive material such as tungsten and a barrier layer 118b which covers the portion 118a and is formed using a conductive material such as titanium or titanium nitride.

The methods and structures described in this embodiment can be combined as appropriate with any of the methods and structures described in the other embodiments.

Embodiment 2

In this embodiment, one embodiment of a method for manufacturing a semiconductor device is described with reference to FIGS. 3A to 3C, FIGS. 4A to 4C, and FIGS. 5A and 5B. In this embodiment, a method for manufacturing the semiconductor device 100 described with reference to FIG. 1A is described as an example.

First, the base insulating film 104 is formed over the substrate 103.

There is no particular limitation on a substrate used as the substrate 103; however, it needs to have at least heat resistance to withstand heat treatment performed later. A variety of glass substrates for electronics industry, such as a barium borosilicate glass substrate and an aluminoborosilicate glass substrate, can be used as the substrate 103. Note that as the substrate, a substrate having a thermal expansion coefficient of greater than or equal to $25\times10^{-7}/°$ C. and less than or equal to $50\times10^{-7}/°$ C. (preferably greater than or equal to $30\times10^{-7}/°$ C. and less than or equal to $40\times10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate 103, the one with a small shrinkage is preferably used. For example, as the substrate, a large-sized glass substrate whose shrinkages after heat treatment for one hour at preferably 450° C., further preferably 500° C. are less than or equal to 20 ppm, preferably less than or equal to 10 ppm, further preferably less than or equal to 5 ppm may be used.

As the substrate 103, a ceramic substrate, a quartz substrate, a sapphire substrate, or the like can also be used. Alternatively, a single crystal semiconductor substrate or a polycrystalline semiconductor substrate made of silicon or silicon carbide, a compound semiconductor substrate made of silicon germanium or the like, an SOI substrate, or the like can be used. Still alternatively, any of these substrates over which a semiconductor element is provided may be used as the substrate 103.

The semiconductor device may be manufactured using a flexible substrate as the substrate 103. To manufacture a flexible semiconductor device, the first transistor 101 including the oxide semiconductor film 107 may be directly formed over a flexible substrate; or alternatively, the first transistor 101 including the oxide semiconductor film 107 and the second transistor 102 including the oxide semiconductor film 110 over the first transistor 101 may be formed over a substrate and then separated and transferred to a flexible substrate. Note that in order to separate the transistor from the manufacturing substrate and transfer it to the flexible substrate, a separation layer may be provided between the manufacturing substrate and the first transistor 101 including the oxide semiconductor film.

Figure 3A:
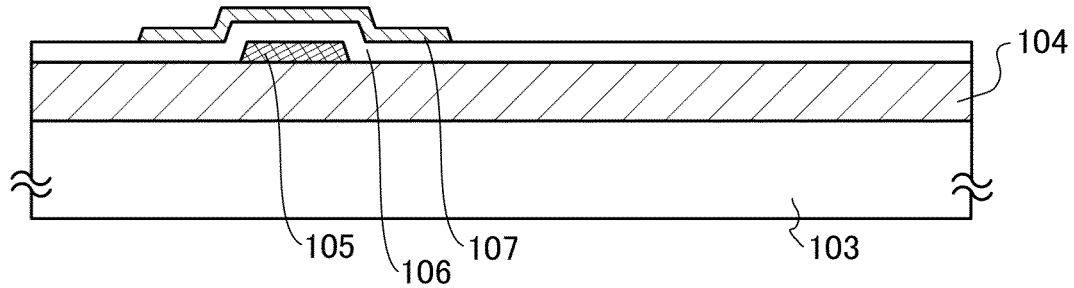
FIGS. 3A to 3C are cross-sectional views illustrating one embodiment of a method for manufacturing a semiconductor device.

The base insulating film 104 may be formed over the substrate 103 (see FIG. 3A). The base insulating film 104 can be formed by a plasma CVD method, a sputtering method, or the like using silicon oxide, silicon oxynitride, aluminum oxide, aluminum oxynitride, hafnium oxide, gallium oxide, gallium zinc oxide, zinc oxide, or a mixed material thereof. The base insulating film 104 may be either a single layer or a stack of layers.

A silicon oxide film is formed by a sputtering method as the base insulating film 104 in this embodiment. For example, the silicon oxide film can be formed by a sputtering method under conditions where a flow ratio of argon and oxygen is 0/50 sccm, a pressure is 0.4 Pa, an RF power is 1.5 kW, a TS distance is 60 nm, and substrate temperature is 100° C. Alternatively, a silicon oxide film, which is formed by a plasma CVD method, or the like may be used.

Further, although not shown, an insulating film serving as the barrier film (protective film) described above may be formed between the substrate 103 and the base insulating film 104.

As the insulating film serving as the barrier film, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium oxide film, a gallium zinc oxide film, or a zinc oxide film can be used; the insulating film may either a single layer or a stacked layer. The insulating film serving as the barrier film can be formed by a plasma CVD method, a sputtering method, or a CVD method using a deposition gas.

Next, a conductive film is formed over the base insulating film 104 by a sputtering method, an evaporation method, or the like and is etched to form the gate electrode layer 105. Note that the conductive film may be etched using either dry etching or wet etching, or using both dry etching and wet etching.

The gate electrode layer 105 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 105. The gate electrode layer 105 may have a single-layer structure or a stacked-layer structure.

The gate electrode layer 105 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 105 has a stacked structure of the above conductive material and the above metal material.

In this embodiment, a tantalum nitride film with a thickness of 30 nm and a tantalum film with a thickness of 135 nm are stacked in this order by a sputtering method to form the gate electrode layer.

Further, after the gate electrode layer 105 is formed, the gate electrode layer 105 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to 1 hour.

Next, a gate insulating film 106 covering the gate electrode layer 105 is formed.

The gate insulating film 106 has a thickness greater than or equal to 1 nm and less than or equal to 300 nm, for example, and can be formed by a sputtering method, a CVD method, an MBE method, a pulsed laser deposition method, an ALD method, or the like as appropriate. As the CVD method, an LPCVD method, a plasma CVD method, or the like can be used. The gate insulating film 106 may also be formed using a sputtering apparatus which performs film formation with surfaces of a plurality of substrates set substantially perpendicular to a surface of a sputtering target. As another method, a coating method or the like can also be used.

The gate insulating film 106 can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. Note that the gate insulating film 106 preferably contains oxygen in a portion in contact with the oxide semiconductor film 107 formed later. In particular, the gate insulating film 106 preferably at least contains oxygen in excess of that in the stoichiometric composition in (a bulk of) the film. In this embodiment, a silicon oxynitride film formed by a CVD method using a microwave is used as the gate insulating film 106. By using a silicon oxynitride film containing a large amount of oxygen as the gate insulating film 106, oxygen can be supplied to the oxide semiconductor film 107, leading to good characteristics. Further, the gate insulating film 106 is preferably formed in consideration of the size of a transistor to be formed and the step coverage with the gate insulating film 106.

Further, gate leakage current can be reduced when the gate insulating film 106 is formed using a high-k material such as hafnium oxide, yttrium oxide, hafnium silicate ($HfSi_xO_y$ ($x>0$, $y>0$)), hafnium silicate to which nitrogen is added ($HfSi_xO_yN_y$ ($x>0$, $y>0$)), hafnium aluminate ($HfAl_xO_y$ ($x>0$, $y>0$)), or lanthanum oxide. The gate insulating film 106 may be either a single-layer structure or a stacked-layer structure.

In this embodiment, a 20-nm-thick silicon oxynitride film is formed by a plasma CVD method.

Next, the oxide semiconductor film 107 is formed over the gate insulating film 106.

In addition, shortly after the oxide semiconductor film 107 is formed, it is preferable that the oxide semiconductor film contains oxygen in a proportion higher than that in the stoichiometric composition, i.e., the oxide semiconductor film is supersaturated. For example, in the case where the oxide semiconductor film 107 is formed by a sputtering method, the film formation is preferably performed under the condition where the proportion of oxygen in a deposition gas is high, in particular, in an oxygen atmosphere (oxygen gas: 100%). When the film formation is performed in the state where the proportion of oxygen in the deposition gas is high, in particular, in an atmosphere containing an oxygen gas at 100%, release of Zn from the film can be suppressed even at a deposition temperature higher than or equal to 300° C.

Note that in this embodiment, for example, an oxide target having a composition of In:Ga:Zn=3:1:2 [atomic percentage] is used for forming the oxide semiconductor film 107 by a sputtering method, so that an In—Ga—Zn-based oxide film (IGZO film) is formed. The oxide semiconductor film 107 is formed under conditions where the oxide target having a composition of In:Ga:Zn=3:1:2 [atomic percentage] is used, substrate temperature is 200° C., and a flow ratio of argon and oxygen is 30/15 sccm, for example.

The relative density (the fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas from which an impurity such as hydrogen, water, a hydroxyl group, or hydride is removed be used as a sputtering gas for the formation of the oxide semiconductor film 107.

The substrate is held in a film formation chamber kept under reduced pressure. Then, a sputtering gas from which hydrogen and moisture are removed is introduced into the film formation chamber where remaining moisture is being removed, and the oxide semiconductor film 107 is deposited with use of the above target, over the gate insulating film 106. In order to remove moisture remaining in the film formation chamber, an entrapment vacuum pump such as a cryopump, an ion pump, or a titanium sublimation pump is preferably used. As an exhaustion unit, a turbo molecular pump to which a cold trap is added may be used. In the film formation chamber which is evacuated with the cryopump, for example, a hydrogen atom, a compound containing a hydrogen atom, such as water ($H_2O$), (further preferably, also a compound containing a carbon atom), and the like are removed, whereby the concentration of an impurity in the oxide semiconductor film 107 formed in the film formation chamber can be reduced.

The oxide semiconductor film 107 can be formed by processing a film-shaped oxide semiconductor film into an island shape by a photolithography process.

The resist mask for forming the island-shaped oxide semiconductor film 107 may be formed by an ink-jet method. Formation of the resist mask by an inkjet method needs no photomask; thus, manufacturing cost can be reduced.

Note that the oxide semiconductor film may be etched using either dry etching or wet etching, or using both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas of $BCL_3$ and $Cl_2$ ($BCL_3$:$Cl_2$=60 sccm: 20 sccm), a power of 450 W, a bias power of 100 W, and a pressure of 1.9 Pa), so that the IGZO film is processed into an island shape.

It is preferable that the oxide semiconductor film 107 be highly purified to contain few impurities such as copper, aluminum, and chlorine. In the process for manufacturing the semiconductor device 100, steps in which these impurities are not mixed or attached to the surface of the oxide semiconductor film 107 are preferably selected as appropriate. In the case where the impurities are attached to the surface of the oxide semiconductor film 107, the impurities on the surface of the oxide semiconductor layer film 107 are preferably removed by exposure to oxalic acid, dilute hydrofluoric acid, or the like or by plasma treatment (such as $N_2O$ plasma treatment). Specifically, the concentration of copper in the oxide semiconductor film 107 is lower than or equal to $1\times10^{18}$ atoms/$cm^3$, preferably lower than or equal to $1\times10^{17}$ atoms/$cm^3$. Further, the concentration of aluminum in the oxide semiconductor film 107 is lower than or equal to $1\times10^{18}$ atoms/$cm^3$. Further, the concentration of chlorine in the oxide semiconductor film 107 is smaller than or equal to $2\times10^{18}$ atoms/$cm^3$.

Further, in order to promote supply of oxygen from the base insulating film 104 to the oxide semiconductor film 107, heat treatment may be performed.

Next, first oxygen supplying treatment is performed on the island-shaped oxide semiconductor film 107. The oxygen supplying treatment includes oxygen doping treatment or the oxygen doping treatment and oxygen annealing treatment.

The first oxygen supplying treatment is treatment performed on the oxide semiconductor film 107 included in the first transistor and then the oxide semiconductor film 107 included in the first transistor is subjected to second oxygen supplying treatment together with the oxide semiconductor film 110 included in the second transistor. Therefore, the first oxygen supplying treatment is also, so to speak, preliminary treatment on the oxide semiconductor film 107; the oxygen supplying treatment on the oxide semiconductor film 107 is finally completed through the second oxygen supplying treatment (but, oxygen supplying treatment may be further performed after the second oxygen supplying treatment).

Through the second oxygen supplying treatment performed later, oxygen vacancies in the oxide semiconductor film 110 included in the second transistor are sufficiently reduced, whereby the threshold voltage of the second transistor is shifted in a positive direction to make the second transistor normally off. Therefore, in the first oxygen supplying treatment, oxygen whose amount is insufficient for reducing oxygen vacancies in the oxide semiconductor film 107 in the second oxygen supplying treatment is adjusted and is introduced in advance.

Therefore, from the amount of oxygen released depending on the structures, the shapes, the materials, and the like and the manufacturing processes of the first transistor and the second transistor, the amount of oxygen necessary for introduction is calculated in advance, whereby the amount of oxygen introduced at the time of the first oxygen supplying treatment is adjusted and the first oxygen supplying treatment can be performed under an optimum condition.

In this manner, the first transistor and the second transistor can be formed by controlling the threshold voltage of the first transistor and the second transistor formed in the layers selectively.

Note that dehydrogenation treatment may be additionally performed before the above-described oxygen supplying treatment. By this dehydrogenation treatment, dehydrogenation of the gate insulating film 106 and the oxide semiconductor film 107 can be performed. Since the dehydrogenation treatment is performed after the oxide semiconductor film 107 is processed into an island shape, in the gate insulating film 106, dehydrogenation is effectively performed from an exposed portion of the top surface.

The dehydrogenation treatment can be performed, for example, in a nitrogen atmosphere at 650° C. for six minutes by heating with a GRTA. The temperature of the heat treatment is set to at least a temperature at which hydrogen or a hydrogen compound is eliminated from the oxide semiconductor film 107. For example, when the temperature is higher than or equal to 100° C., the amount of hydrogen included in the oxide semiconductor film 107 can be reduced. Of course, the heat treatment may be performed at high temperature as long as the amount of hydrogen included in the oxide semiconductor film 107 can be reduced and the upper limit of the heat treatment temperature may be a temperature lower than or equal to the strain point of the substrate.

By the heat treatment, part of hydrogen eliminated from the oxide semiconductor film 107 reacts with oxygen, so that a hydrogen compound (for example, $H_2O$ or OH) formed in this manner is released from the oxide semiconductor film 107. Therefore, if oxygen is not supplied by the oxygen supplying treatment, the eliminated hydrogen takes oxygen which is bonded to a metal element (for example, oxygen of In—O bonds) in the oxide semiconductor film 107 and a reaction is caused, so that a hydrogen compound formed in this manner is released; thus, oxygen vacancies are formed in the oxide semiconductor film 107.

As the first oxygen supplying treatment, oxygen annealing treatment can be performed. The oxygen annealing treatment is performed, for example, in an oxygen atmosphere at 450° C. for 1 hour by heating. In also this oxygen annealing treatment, hydrogen or a hydrogen compound is eliminated from the oxide semiconductor film 107 by heating. Therefore, the above-described dehydrogenation treatment can also serve as the oxygen annealing treatment.

Figure 3B:
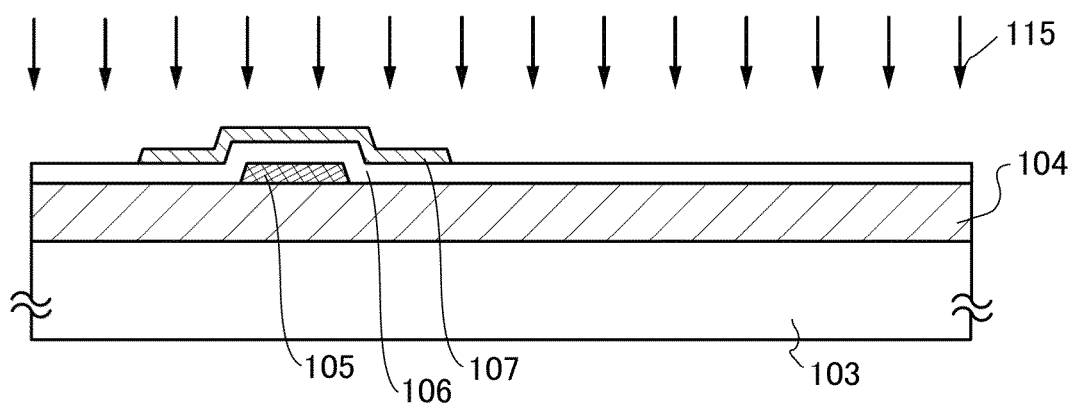

Further, as the first oxygen supplying treatment, oxygen doping treatment in which oxygen 115 is introduced into the oxide semiconductor film 107 is performed (see FIG. 3B).

Note that the "oxygen doping" means that the oxygen 115 (which includes at least one of an oxygen radical, an oxygen atom, an oxygen molecule, ozone, an oxygen ion (oxygen molecular ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for oxygen doping treatment. As the gas containing oxygen, oxygen, dinitrogen monoxide, nitrogen dioxide, carbon dioxide, carbon monoxide, or the like can be used. Further, a rare gas may be included in the gas containing oxygen for the oxygen doping treatment.

The oxygen doping treatment can be performed by, for example, an ion implantation method, an ion doping method, a plasma immersion ion implantation method, plasma treatment, or the like. For the ion implantation method, a gas cluster ion beam may be used. In the case of using the ion implantation method, the oxygen doping treatment can be performed with a dose of oxygen greater than or equal to $0.5\times10^{15}$ $cm^{-2}$ and less than or equal to $5\times10^{16}$ $cm^{-2}$ at acceleration voltage higher than or equal to 5 kV and lower than or equal to 20 kV.

The oxygen 115 may be introduced into the entire surface of the substrate at a time. Alternatively, a linear ion beam may be used, for example. In the case of using the linear ion beam, the substrate or the ion beam is relatively moved (scanned), whereby the oxygen 115 can be introduced into the entire surface of the island-shaped oxide semiconductor film 107.

In this embodiment, for example, the oxygen doping treatment is performed at acceleration voltage of 5 kV with a dose of $5.0\times10^{15}$ $cm^{-2}$ using oxygen ions ($^{16}O+$).

By the above oxygen supplying treatment, the oxide semiconductor film 107 including excessive oxygen (an oxygen atom contained in a proportion higher than that of oxygen in the stoichiometric composition) is formed. Note that in the case where both of the oxygen doping treatment and the oxygen annealing treatment are performed as the oxygen supplying treatment, either the oxygen doping treatment or the oxygen annealing treatment may be performed first.

Figure 3C:
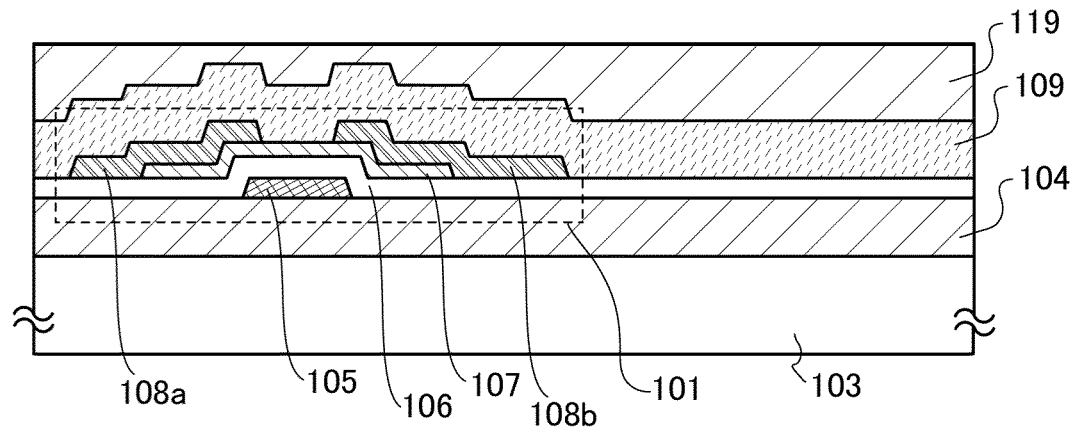

Next, the source electrode layer 108a and the drain electrode layer 108b which are electrically connected to the oxide semiconductor film 107 are formed (see FIG. 3C). A variety of circuits can be formed by connection with another transistor or element in the same layer or in a different layer with the use of the source electrode layer 108a and the drain electrode layer 108b.

The source electrode layer 108a and the drain electrode layer 108b can be formed in such a manner that a conductive film is deposited by a sputtering method, an evaporation method, or the like, and the conductive film is processed by an etching method, for example.

As the conductive film used for the source electrode layer 108a and the drain electrode layer 108b, a material with good oxidation resistance that can resist the second oxygen supplying treatment performed later is used as appropriate. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium tin oxide (ITO), indium zinc oxide (IZO), or any of these metal oxide materials containing silicon oxide can be used.

Next, the interlayer insulating film 109 is formed to cover the oxide semiconductor film 107, the source electrode layer 108a, and the drain electrode layer 108b. By the formation of the interlayer insulating film 109, a top surface of the structure can be covered with good coverage.

For example, a 460-nm-thick silicon oxynitride film is stacked over a 70-nm-thick aluminum oxide film by a CVD method to form the interlayer insulating film 109. This silicon oxynitride film may be doped with oxygen.

In addition, heat treatment may be performed after the interlayer insulating film 109 is formed. For example, the heat treatment is performed in an oxygen atmosphere at 400° C. for 1 hour.

Next, the base insulating film 119 is formed over the interlayer insulating film 109. The base insulating film 119 can be formed using a material and a method that are similar to those of the base insulating film 104 described above. As the base insulating film 119, for example, a 330-nm-thick silicon oxide film can be formed.

The silicon oxide film can be formed by a sputtering method under conditions where a flow ratio of argon and oxygen is 0/50 sccm, a pressure is 0.4 Pa, an RF power is 1.5 kW, a TS distance is 60 nm, and substrate temperature is 100° C.

Then, a top surface of the base insulating film 119 is subjected to CMP (chemical mechanical polishing) treatment to planarize the top surface (see FIG. 3C). It is preferable that $R_a$ be less than or equal to 0.2 nm.

Next, the second transistor in the upper layer is formed over the base insulating film 119. Here, the second transistor is a top-gate transistor. First, the oxide semiconductor film 110 is formed over the base insulating film 119.

The oxide semiconductor film 110 may be formed using a material, a structure, and a method that are similar to those of the oxide semiconductor film 107 of the first transistor 101. The formed oxide semiconductor film 110 is processed into an island shape (see FIG. 4A).

Here, a portion which serves as a channel formation region of the second transistor in the island-shaped oxide semiconductor film 110 is formed so as not to overlap with a portion which serves as a channel formation region 107a of the first transistor 101 in the island-shaped oxide semiconductor film 107. Note that a portion which does not serve as a channel formation region of the second transistor in the island-shaped oxide semiconductor film 110 may be positioned so as to overlap with a portion which does not serve as a channel formation region of the first transistor 101 in the island-shaped oxide semiconductor film 107.

Figure 4A:
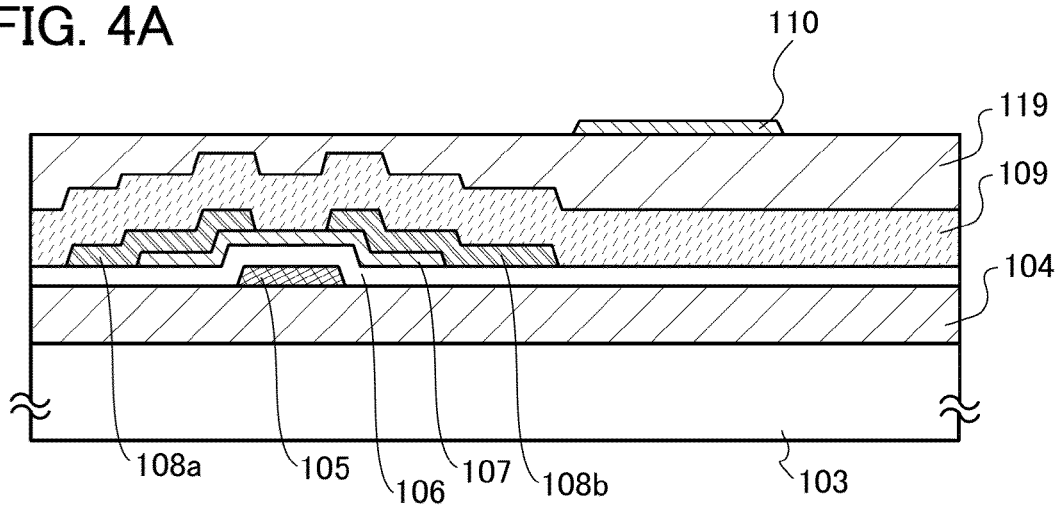
FIGS. 4A to 4C are cross-sectional views illustrating one embodiment of a method for manufacturing a semiconductor device.
Figure 4B:
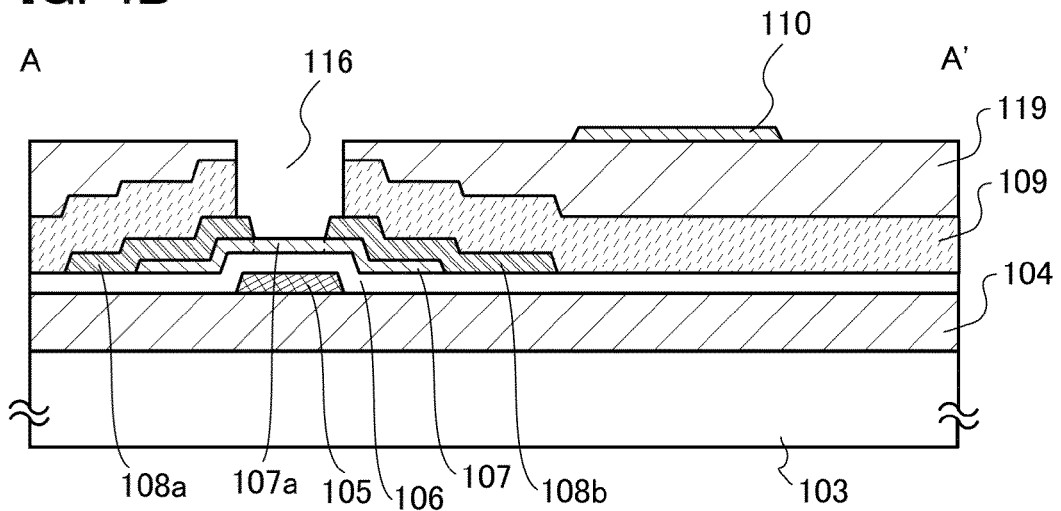

Next, part of the interlayer insulating film 109 and the base insulating film 119 positioned directly over the channel formation region 107a of the first transistor 101 are etched, so that the opening 116 is formed in these films (see FIG. 4B).

The opening 116 is formed by forming a photo resist mask over the base insulating film 119 through a photolithography step and performing selective etching. The interlayer insulating film 109 and the base insulating film 119 may be etched using either dry etching or wet etching, or using both dry etching and wet etching As a dry etching method, for example, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In the case of using the ICP etching method, etching can be performed, for example, at an ICP power of 475 W, a bias power of 300 W, a pressure of 5.5 Pa, and a flow ratio of $CHF_3$ and He of 7.5/142.5 sccm for 120 seconds.

Figure 8A:
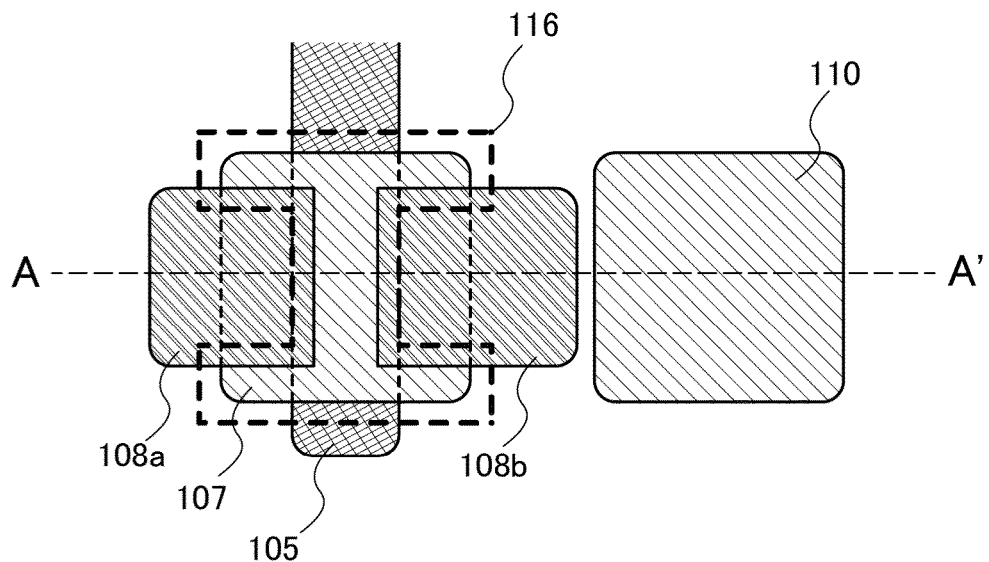
FIGS. 8A and 8B are plan views illustrating a region where an opening is formed.
Figure 8B:
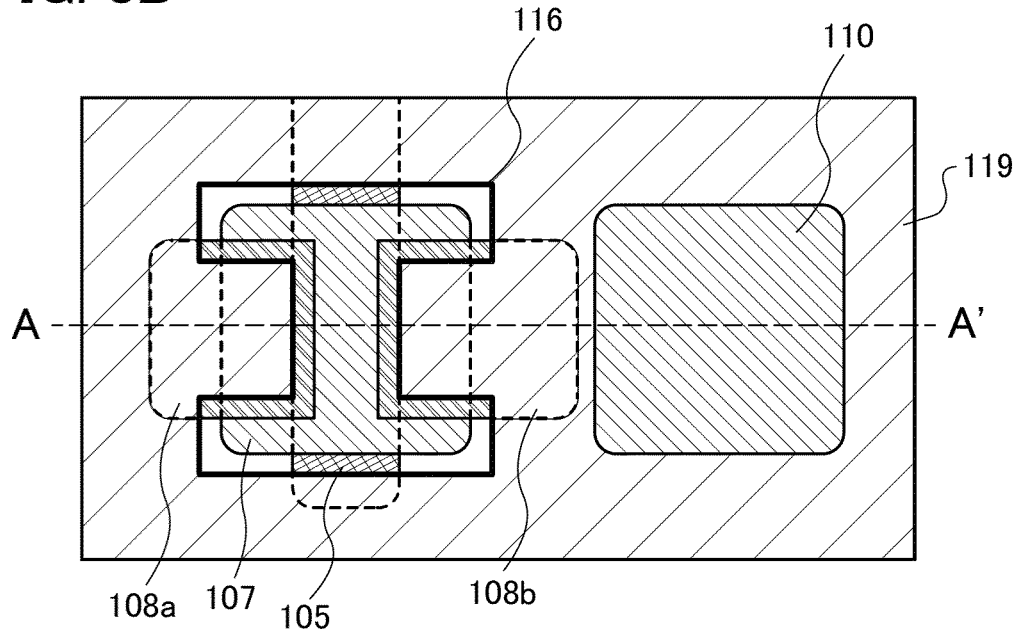

FIGS. 8A and 8B illustrate an example of a region where the opening 116 is formed. FIGS. 8A and 8B are plan schematic diagrams including a cross-sectional structure illustrated in FIG. 4B as A-A'. For clarity, FIG. 8A is a plan view in which the insulating films are omitted and FIG. 8B is a plan view in which the insulating film is illustrated; however, FIGS. 8A and 8B illustrate essentially the same shape.

As illustrated in FIG. 8A, the island-shaped oxide semiconductor film 107 and the island-shaped oxide semiconductor film 110 are positioned so as not to overlap with each other. However, as described above, except the regions which serve as the channel formation regions, the island-shaped oxide semiconductor film 107 and the island-shaped oxide semiconductor film 110 may partly overlap with each other. As illustrated in FIG. 8B, the island-shaped oxide semiconductor film 110 is positioned over the base insulating film 119 and the island-shaped oxide semiconductor film 107 is positioned under the base insulating film 119. The opening 116 is formed by removing part of the insulating films positioned directly over the region which serves as the channel formation region of the island-shaped oxide semiconductor film 107. In FIGS. 8A and 8B, part of the interlayer insulating film and the base insulating film 119 are removed by etching the interlayer insulating film and the base insulating film 119 to have the opening 116 with an I shape. By the etching of the interlayer insulating film and the base insulating film 119, the island-shaped oxide semiconductor film 107 is exposed up to an end portion (edge portion) which is not covered with the source electrode layer 108*a* and the drain electrode layer 108*b*. In addition, by the etching, the source electrode layer 108*a* and the drain electrode layer 108*b* are also partly exposed.

Figure 7A:
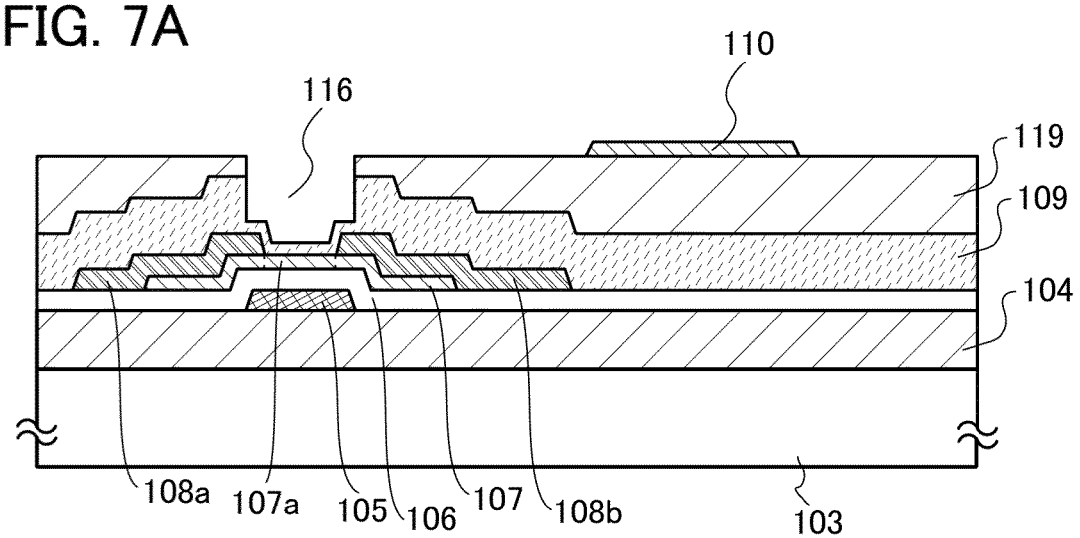
FIGS. 7A and 7B are cross-sectional views illustrating one embodiment of a semiconductor device.
Figure 7B:
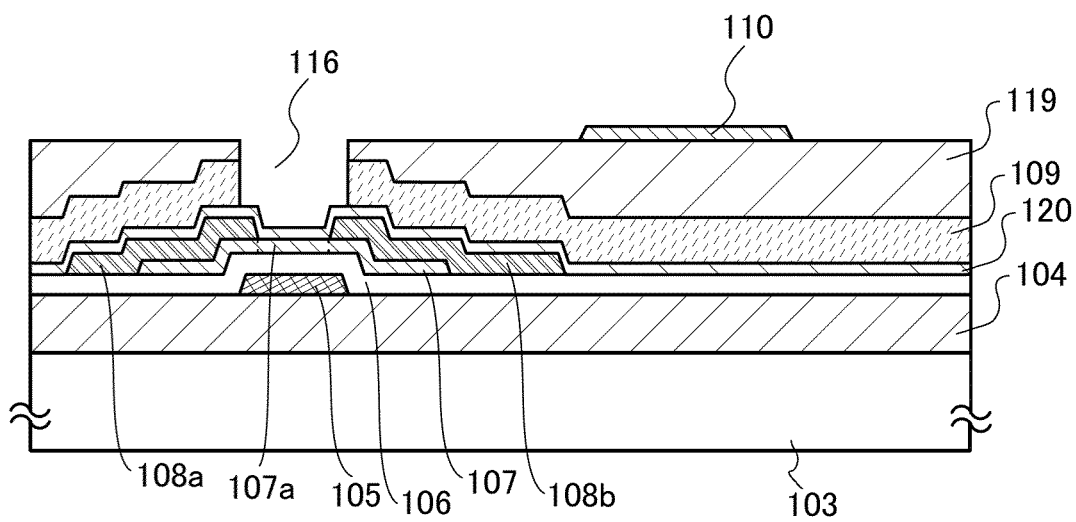

Here, the opening 116 may reach a surface of the oxide semiconductor film 107 to expose the surface of the oxide semiconductor film 107 completely. Alternatively, the opening 116 may be formed in such a manner that the insulating film with a certain thickness that allows the oxygen supplying treatment is left over the surface of the oxide semiconductor film 107 (see FIG. 7A). Further alternatively, an etching stopper 120 may be provided between the oxide semiconductor film 107 and the interlayer insulating film 109, and the opening 116 may be formed to expose a surface of the etching stopper 120. In this case, a material for the etching stopper 120 is selected so that a high etching selectivity ratio of the etching stopper 120 to the interlayer insulating film 109 or the base insulating film 119 is obtained. With the etching stopper 120, the surface of the oxide semiconductor film 107 or top surfaces and side surfaces of the source electrode layer 108*a* and the drain electrode layer 108*b* can be protected from being damaged by the etching.

Next, oxygen supplying treatment is performed on the oxide semiconductor film 107 that is partly exposed and the oxide semiconductor film 110. This second oxygen supplying treatment is oxygen supplying treatment of the oxide semiconductor film 110 included in the second transistor and is also oxygen doping treatment of the oxide semiconductor film 107 included in the first transistor.

By this second oxygen supplying treatment, oxygen vacancies in the oxide semiconductor film 110 included in the second transistor can be sufficiently reduced. Further, in addition to the above, oxygen vacancies in the oxide semiconductor film 107 included in the first transistor, which has been insufficiently reduced in the first oxygen supplying treatment or which has been increased in a later step, can be further reduced.

Therefore, the conditions of the second oxygen supplying treatment are conditions where oxygen vacancies in the oxide semiconductor film 110 included in the second transistor are sufficiently reduced, and the conditions of the first oxygen supplying treatment are optimized so that oxygen vacancies in the oxide semiconductor film 107 included in the first transistor are also sufficiently reduced.

The second oxygen supplying treatment includes oxygen doping treatment or the oxygen doping treatment and oxygen annealing treatment, which is similar to the first oxygen supplying treatment.

Note that dehydrogenation treatment may be additionally performed before the second oxygen supplying treatment. By this dehydrogenation treatment, dehydrogenation of the oxide semiconductor film 110 and the oxide semiconductor film 107 exposed in the opening 116 of the insulating films can be performed. The conditions of the dehydrogenation treatment follow the conditions of the dehydrogenation treatment performed before the first oxygen supplying treatment.

As the second oxygen supplying treatment, oxygen annealing treatment can be performed. The oxygen annealing treatment is performed based on appropriate conditions which are similar to the conditions of the first oxygen supplying treatment, for the above reason. The oxygen annealing treatment is performed, for example, in an oxygen atmosphere at a temperature higher than or equal to 150° C. and lower than or equal to 450° C. by heating. This is because oxygen is not diffused at a low temperature less than 150° C.; on the other hand, the treatment at a high temperature affects components in a semiconductor device such as an electrode material and thus the use of such components needs to be limited. Further, in order to prevent diffusion of hydrogen into the oxide semiconductor film, the oxygen annealing treatment is preferably performed in a gas atmosphere having a low dew point (for example, −60° C.). In also this oxygen annealing treatment, hydrogen or a hydrogen compound can be eliminated from the oxide semiconductor film 107 and the oxide semiconductor film 110 by heating. Therefore, the above-described dehydrogenation treatment can also serve as the oxygen annealing treatment.

Figure 4C:
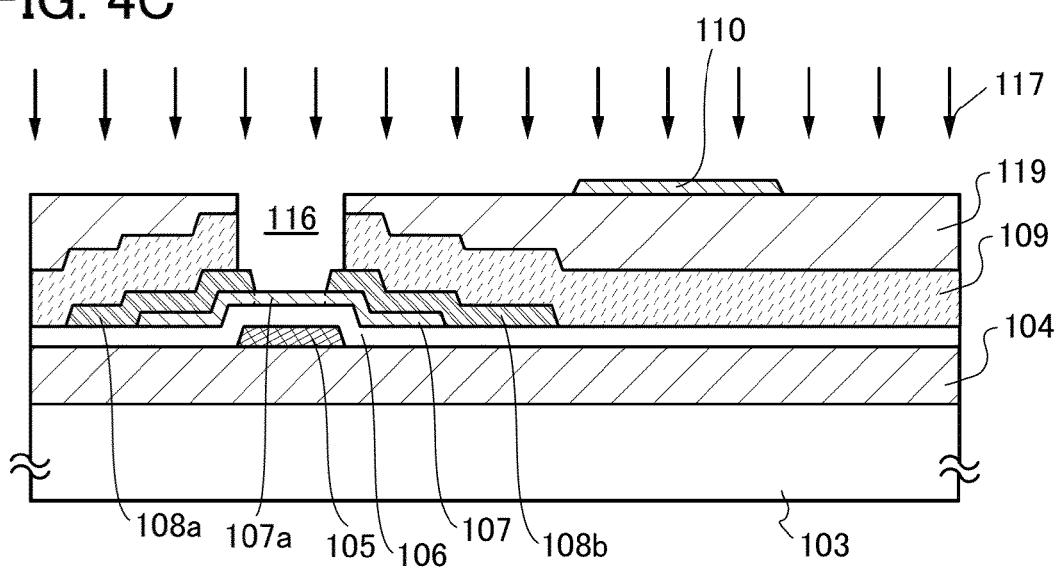

Further, as the second oxygen supplying treatment, oxygen doping treatment in which oxygen 117 is introduced into the oxide semiconductor film 110 and the oxide semiconductor film 107 exposed in the opening 116 of the insulating films is performed (see FIG. 4C).

In this embodiment, for example, the oxygen doping treatment is performed at acceleration voltage of 5 kV with a dose of $2.5 \times 10^{15}$ cm using oxygen ions ($^{32}$O+). In the case of using the ion implantation method, the oxygen doping treatment can be performed with a dose of oxygen greater than or equal to $0.5 \times 10^{15}$ cm$^{-2}$ and less than or equal to $5 \times 10^{16}$ cm$^{-2}$ at acceleration voltage higher than or equal to 5 kV and lower than or equal to 20 kV.

With a combination of the first oxygen supplying treatment and the second oxygen supplying treatment, oxygen vacancies in the oxide semiconductor film 107 and the oxide semiconductor film 110 can be efficiently reduced.

In this embodiment, through the above manufacturing steps, the top-gate second transistor 102 is formed in the upper layer with the use of the oxide semiconductor film 110 in which oxygen vacancies are sufficiently reduced. Note that the structure of the second transistor 102 disclosed below is one example. Specifically, any of various structures can be employed.

Figure 5A:
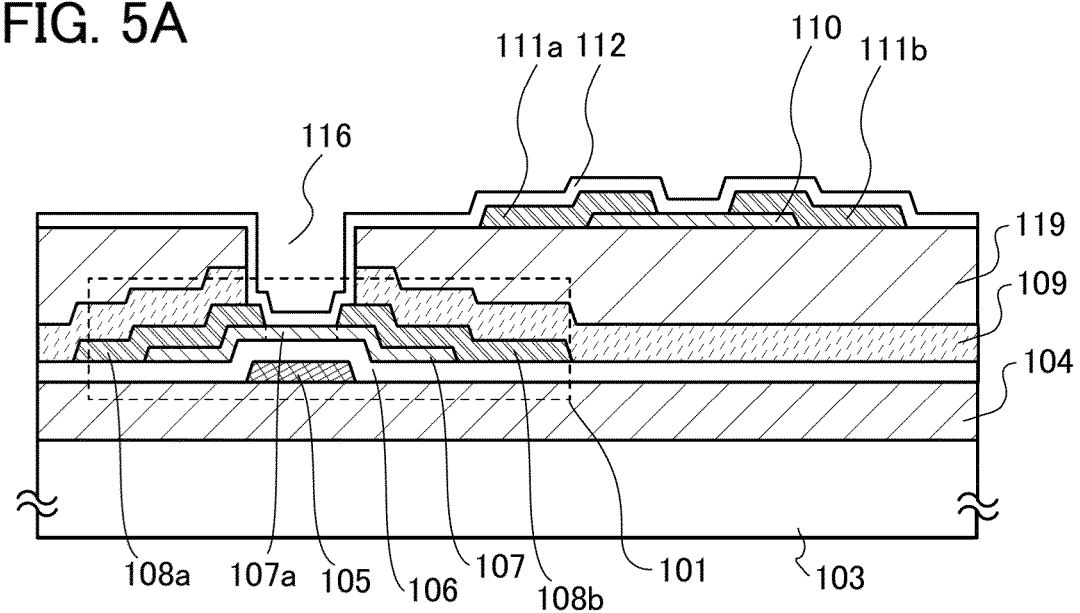
FIGS. 5A and 5B are cross-sectional views illustrating one embodiment of a method for manufacturing a semiconductor device.

As illustrated in FIG. 5A, the source electrode layer 111*a* and the drain electrode layer 111*b* are formed over the oxide semiconductor film 110. The source electrode layer 111*a* and the drain electrode layer 111*b* are provided in contact with part of side surfaces and part of a top surface of the oxide semiconductor film 110, and are electrically connected to the oxide semiconductor film 110. A formation method of the source electrode layer 111*a* and the drain electrode layer 111*b* follows the formation method of the source electrode layer 108*a* and the drain electrode layer 108*b* of the first transistor. For example, an electrode layer of tungsten can be formed by a sputtering method.

Next, the gate insulating film 112 is formed to cover the base insulating film 119, the oxide semiconductor film 110, the source electrode layer 111*a*, and the drain electrode layer 111*b*. A formation method of the gate insulating film 112 follows the formation method of the gate insulating film 106 of the first transistor. For example, as the gate insulating film 112, a silicon oxynitride film can be formed by a plasma CVD method.

At this time, the opening 116 for performing the second oxygen supplying treatment on the oxide semiconductor film 107 included in the first transistor 101 is covered with the gate insulating film 112. Therefore, the exposed top surface of the oxide semiconductor film 107 and the side surface of the opening 116 provided in the interlayer insulating film 109 and the base insulating film 119 are covered with the gate insulating film 112.

Next, the gate electrode layer 113 of the second transistor 102 is formed. The gate electrode layer 113 is provided at a position where the gate electrode layer 113 faces the oxide semiconductor film 110 with the gate insulating film 112 provided therebetween. The gate electrode layer 113 can be formed using a formation method similar to that of the gate electrode layer 105 of the first transistor 101. For example, a stacked-layer structure of a tantalum nitride film and a tungsten film can be formed by a sputtering method as the gate electrode layer 113.

Figure 5B:
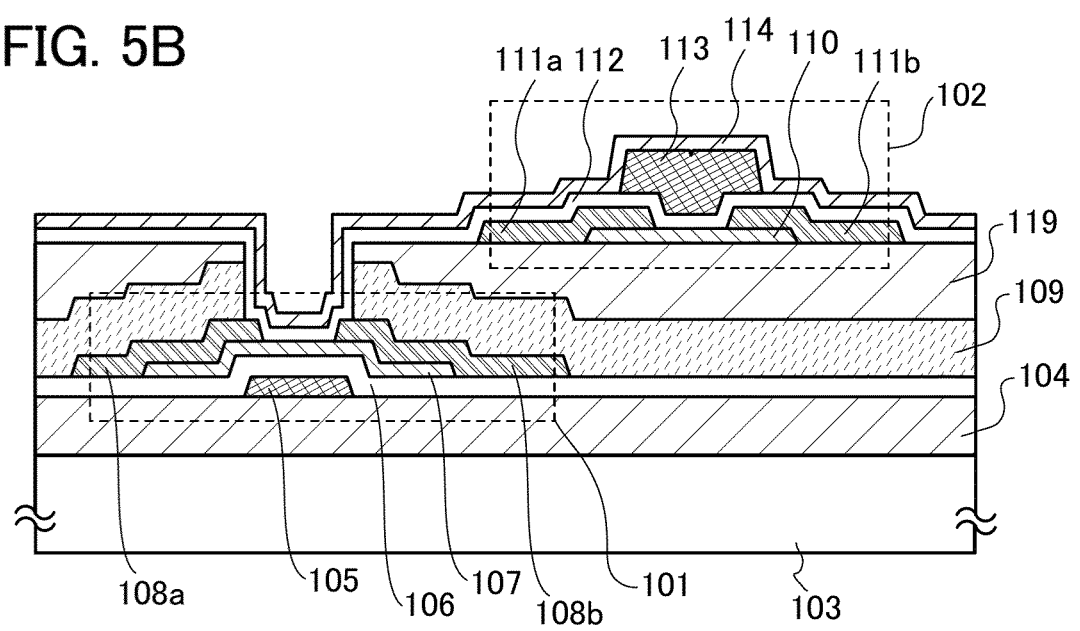

Next, as illustrated in FIG. 5B, the protective insulating film 114 is formed so as to cover the second transistor 102. The protective insulating film 114 has a function of preventing entry of moisture or contaminant from the outside. Therefore, there is no particular limitation on a material and a manufacturing method of the protective insulating film 114 as long as a film having the function can be formed.

As the protective insulating film 114, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium zinc oxide film, or a zinc oxide film can be used, and the protective insulating film 114 may be either a single layer or a stacked layer. The protective insulating film 114 can be formed by a plasma CVD method, a sputtering method, or a CVD method using a deposition gas.

After the protective insulating film 114 is formed, annealing treatment is performed in an air atmosphere or the like. The annealing treatment is performed, for example, in an air atmosphere at 300° C. for 1 hour.

Through the above steps, a semiconductor device having a layered structure including the lower layer in which the first transistor 101 is positioned and the upper layer in which the second transistor 102 is positioned is manufactured.

Note that in this embodiment, the electrical connection between the first transistor 101 in the lower layer and the second transistor 102 in the upper layer is not described; however, as described above with reference to FIGS. 6A and 6B, an opening may be formed in the interlayer insulating film 109, the base insulating film 119, or the like, so that the electrode layers are connected to each other as appropriate using a conductive material.

In the case where the number of layers is increased and a layered structure having three or more layers is formed, an interlayer insulating film or a base insulating film may be formed instead of the protective insulating film 114 and the layered structure may be formed through similar steps.

In the case of forming a layered structure having three or more layers, as the number of layers is increased, formation of an opening for the oxygen supplying treatment becomes more difficult in terms of the manufacturing process. In view of this situation, for example, an opening can be formed every two layers and then the oxygen supplying treatment can be performed.

As described above, the oxygen supplying treatment is performed twice using the opening, whereby oxygen vacancies in the oxide semiconductor films provided in different layers can be sufficiently reduced. Therefore, the threshold voltage of each of the transistors including the oxide semiconductor films provided in different layers can be shifted in a positive side to make the transistors normally off.

Embodiment 3

In this embodiment, one embodiment of a logic circuit included in a semiconductor device having a layered structure and using a transistor, which is described in this specification, is described with reference to FIGS. 9A and 9B and FIG. 10. As one embodiment of a logic circuit, a NOR circuit and a NAND circuit are used here.

Figure 9A:
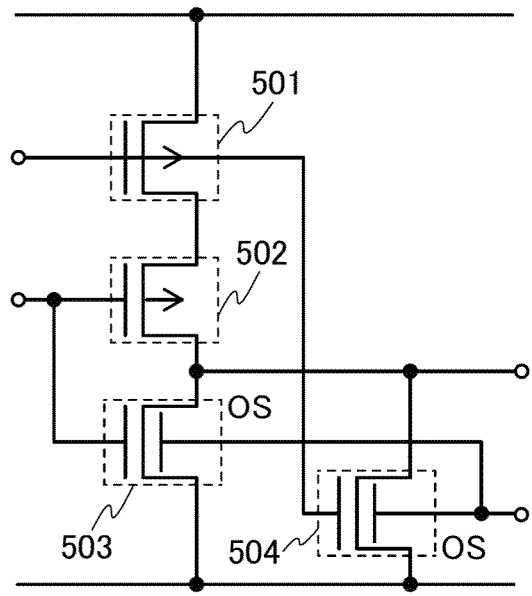
FIGS. 9A to 9C are circuit diagrams of one embodiment of a semiconductor device.
Figure 9B:
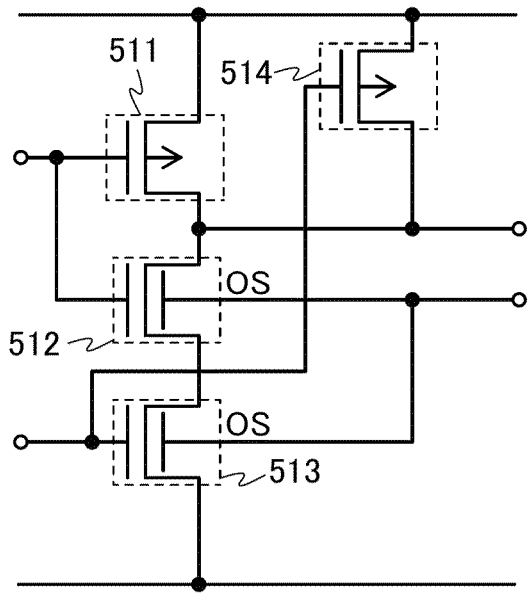

FIG. 9A is a circuit diagram of a NOR circuit, and FIG. 9B is a circuit diagram of a NAND circuit.

In the NOR circuit illustrated in FIG. 9A, a transistor 501 and a transistor 502 are p-channel transistors. A first transistor 503 and a second transistor 504 are n-channel transistors. As the first transistor 503 and the second transistor 504, any of the transistors in each of which an oxide semiconductor film is used for a channel formation region, which are described in the above embodiments, can be used.

In the NAND circuit illustrated in FIG. 9B, a transistor 511 and a transistor 514 are p-channel transistors. A transistor 512 and a transistor 513 are n-channel transistors. As the transistor 512 and the transistor 513, any of the transistors described in the above embodiments can be used. Note that "OS" in FIGS. 9A and 9B shows that any of the transistors described in the above embodiments can be used as the first transistor 503, the second transistor 504, the transistor 512, and the transistor 513.

In the NOR circuit and the NAND circuit in FIGS. 9A and 9B, a transistor including a back-gate electrode can also be used as the first transistor 503, the second transistor 504, the transistor 512, and the transistor 513. With such a structure, different potentials can be applied to a plurality of gate electrodes; thus, the threshold voltage of the transistor can be controlled and the threshold voltage can be shifted in a positive direction. Alternatively, when the same potential is applied to the plurality of gate electrodes, the on-state current of the transistor can be increased.

Here, a cross-sectional structure of the NOR circuit in FIG. 9A is described with reference to FIG. 10.

The transistor 501 and the transistor 502 illustrated in FIG. 9A are formed in a substrate 601 including a semiconductor material such as silicon as transistors in the lowest layer. The first transistor 503 illustrated in FIG. 9A is formed in a layer above the transistor 501 and the transistor 502. The second transistor 504 is formed in a layer above the first transistor 503. Therefore, the NOR circuit illustrated in FIG. 10 has a structure in which a plurality of transistors is provided in different layers. Here, in each of the first transistor 503 and the second transistor 504, an oxide semiconductor film can be used for a channel formation region. Therefore, the first transistor 503 and the second transistor 504 provided in different layers can be manufactured by the method described in Embodiment 2.

Either an n-channel transistor (NMOSFET) or a p-channel transistor (PMOSFET) can be used as each of the transistor 501 and the transistor 502 provided in the substrate 601 including a semiconductor material. In this example of the NOR circuit, a p-channel transistor is used as each of the transistor 501 and the transistor 502. In the example illustrated in FIG. 10, the transistors 501 and 502 in one island are electrically isolated from other elements by a shallow trench isolation (STI) 603. The use of the STI 603 can reduce the generation of a bird's beak in an element isolation region, which is caused in an LOCOS element isolation method, and can reduce the size of the element isolation region. On the other hand, in a semiconductor device that is not required to be structurally miniaturized or downsized, the STI 603 is not necessarily formed, and an element isolation means such as LOCOS can be used. A well 602 to which an impurity imparting conductivity is added is formed in the substrate 601 in which the transistor 501 and the transistor 502 are formed.

Figure 10:
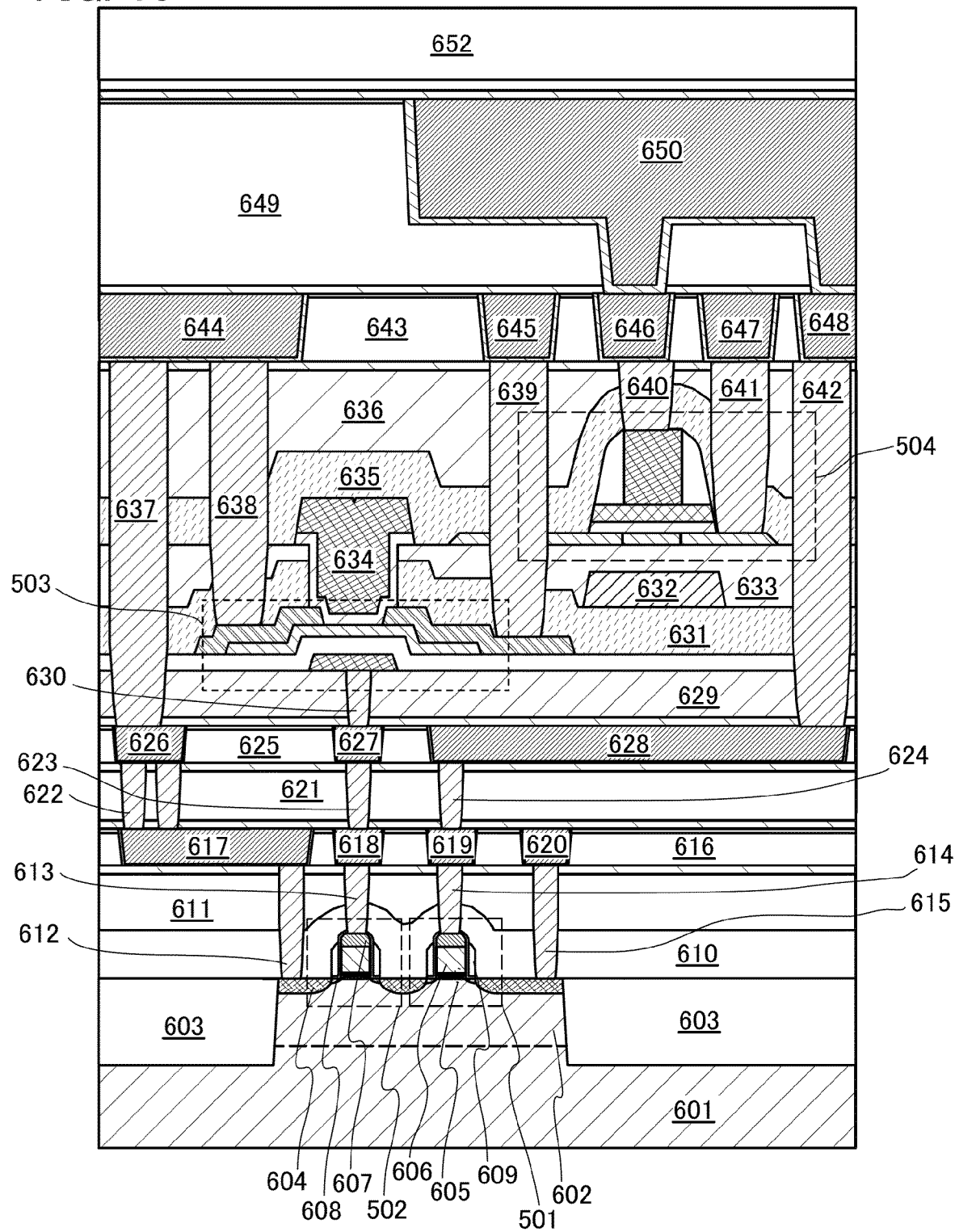
FIG. 10 is a cross-sectional view illustrating one embodiment of a semiconductor device.

The transistors 501 and 502 in FIG. 10 each include a channel formation region provided in a substrate 601, impurity regions 604 (also referred to as a source region and a drain region) provided such that the channel formation region is provided therebetween, a gate insulating film 605 provided over the channel formation region, and gate electrode layers 606 and 607 provided over the gate insulating film 605 so as to overlap with the channel formation region. The gate electrode layer can have a stacked structure of the gate electrode layer 606 including a first material for increasing processing accuracy and the gate electrode layer 607 including a second material for decreasing the resistance as a wiring. For example, a stacked-layer structure of crystalline silicon to which an impurity such as phosphorus imparting conductivity is added and nickel silicide is given. However, the gate electrode layer is not limited to this structure, and the material, the number of stacked layers, the shape, or the like can be adjusted as appropriate for required specifications.

Further, contact plugs 612 and 615 are connected to the impurity regions 604 provided in the substrate 601. Here, the contact plugs 612 and 615 also function as a source electrode and a drain electrode of a transistor connected to the contact plugs 612 and 615. In addition, impurity regions which are different from the impurity regions 604 are provided between the impurity regions 604 and the channel formation region. The impurity regions function as LDD regions or extension regions for controlling the distribution of an electric field in the vicinity of the channel formation region, depending on the concentration of an impurity introduced thereto. Sidewall insulating films 609 are provided at side surfaces of the gate electrode layers 606 and 607 with an insulating film 608 interposed therebetween. By using the insulating film 608 and the sidewall insulating films 609, the LDD regions or extension regions can be formed.

The transistors 501 and 502 are covered with an insulating film 610. The insulating film 610 can function as a protective film and can prevent impurities from entering the channel formation region from the outside. In addition, when the insulating film 610 is formed using a material such as silicon nitride by a CVD method, in the case where single crystal silicon is used for the channel formation region, hydrogenation can be performed by heat treatment. When an insulating film having tensile stress or compressive stress is used as the insulating film 610, distortion can be caused in the semiconductor material in the channel formation region. By subjecting a silicon material in the channel formation region to tensile stress in the case of an n-channel transistor or subjecting a silicon material in the channel formation region to compressive stress in the case of a p-channel transistor, the field-effect mobility of the transistor can be improved.

Further, an insulating film 611 is formed over the insulating film 610 and planarization treatment is performed on the surface thereof by CMP. Thus, an element layer can be stacked with high accuracy in a layer above the layer including the transistors 501 and 502.

A layer including the first transistor 503 in which an oxide semiconductor film is used for the channel formation region is formed in an layer above the layer including the transistors 501 and 502 and then a layer including the second transistor 504 in which an oxide semiconductor film is used for a channel formation region is formed over the layer including the first transistor 503. The layered structure including the first transistor 503 and the second transistor 504 can be formed by the method described in Embodiment 2. Therefore, the channel formation region of the first transistor 503 and the channel formation region of the second transistor 504 are positioned so as not to overlap with each other. The first transistor 503 and the second transistor 504 are surrounded by insulating films, for example, base insulating films 629, 633, and 636 and interlayer insulating films 631 and 635, as described in the above embodiments. Note that a protective insulating film 652 is formed in the uppermost layer, whereby moisture or contaminant is prevented from entering the semiconductor device from the outside.

The layered structure including the first transistor 503 and the second transistor 504 is formed by the method described in Embodiment 2, whereby the oxygen supplying treatment can be efficiently performed, and oxygen vacancies in the oxide semiconductor films can be sufficiently reduced. Thus, the transistors can be made normally off.

Note that in this embodiment, the first transistor 503 is a bottom-gate transistor and the second transistor 504 is a top-gate transistor. A back gate electrode layer 634 is formed in the first transistor 503 and a back gate electrode layer 632 is formed in the second transistor 504. The back gate electrode layer is provided and thus, the transistor can serve as a normally-off transistor.

In order to form an electrical circuit by electrical connection of transistors in the layer including the transistors 501 and 502, transistors in the layer including the first transistor 503, and transistors in the layer including the second transistor 504, wiring layers for connection having a single-layer structure or a stacked-layer structure are formed between the layers and in the upper layer.

In FIG. 10, in order to obtain the NOR circuit illustrated in FIG. 9A, the gate electrode layer of the transistor 502 is electrically connected to a gate electrode layer of the first transistor 503 through a contact plug 613, a wiring layer 618, a contact plug 623, a wiring layer 627, and a contact plug 630. One of a source electrode layer and a drain electrode layer of the transistor 502 is electrically connected to one of a source electrode layer and a drain electrode layer of the transistor 501. The other of the source electrode layer and the drain electrode layer of the transistor 502 is electrically connected to one of a source electrode layer and a drain electrode layer of the first transistor 503 through a contact plug 612, a wiring layer 617, a contact plug 622, a wiring layer 626, a contact plug 637, a wiring layer 644, and a contact plug 638. The wiring layer 644 is a wiring electrically connected to a power source which supplies Low potential. The gate electrode layer of the transistor 501 is electrically connected to a gate electrode layer of the second transistor 504 through a contact plug 614, a wiring layer 619, a contact plug 624, a wiring layer 628, a contact plug 642, a wiring layer 648, a wiring layer 650, a wiring layer 646, and a contact plug 640. Further, the other of the source electrode layer and the drain electrode layer of the transistor 501 is electrically connected to a wiring layer 620 electrically connected to a power source which supplies High potential through a contact plug 615. The other of the source electrode layer and the drain electrode layer of the first transistor 503 is electrically connected to one of a source electrode layer and a drain electrode layer of the second transistor 504 through a contact plug 639. Here, the contact plug 639 penetrates the oxide semiconductor film included in the second transistor 504 and is electrically connected to the first transistor 503. In such a manner, the contact plug 639 penetrates the oxide semiconductor film to be electrically connected, which results in a reduction in contact resistance between the oxide semiconductor film and the contact plug to be connected. Further, the other of the source electrode layer and the drain electrode layer of the second transistor 504 is electrically connected to a wiring layer 647 through a contact plug 641. The wiring layer 647 is a wiring electrically connected to a power source which supplies Low potential like the wiring layer 644.

The wiring layers 617, 618, 619, 620, 626, 627, 628, 644, 645, 646, 647, 648, and 650 are embedded in insulating films. For these wiring layers, it is preferable to use a low-resistance conductive material such as copper or aluminum. Alternatively, the wiring layers can be formed using graphene formed by a CVD method as a conductive material. The graphene refers to one-atom-thick sheet of carbon molecules having $sp^2$ bonds or a stack in which a plurality of one-atom-thick sheets (the number of sheets is 2 to 100) of carbon molecules is stacked. As a method for forming such graphene, a thermal CVD method, in which graphene is formed over a metal catalyst, a plasma CVD method, in which plasma is locally generated by irradiation with ultraviolet light and thus graphene is formed using methane without a catalyst, or the like is given.

By using such a low-resistance conductive material, RC delay of signals transmitted through the wiring layers can be reduced. When copper is used for the wiring layers, a barrier film is formed in order to prevent copper from diffusing into the channel formation region. The barrier film can be formed using a film of tantalum nitride, a stacked-layer film of tantalum nitride and tantalum, a film of titanium nitride, a stacked-layer film of titanium nitride and titanium, or the like, but are not limited to the films of these materials as long as their function of preventing diffusion of a wiring material and their adhesion to the wiring material, a base film, or the like are secured. The barrier film may be formed as a layer that is separate from the wiring layer, or may be formed in such a manner that a material of the barrier film is included in a wiring material and separated out by heat treatment on the inner wall of an opening provided in an insulating film.

The insulating films 611, 616, 621, 625, 643, and 649 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethyl orthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of the semiconductor device, parasitic capacitance between wirings is significant and signal delay is increased. Therefore, the relative permittivity of silicon oxide (k=4.0 to 4.5) is too high, and it is preferable to use a material with k=3.0 or less. In addition, since CMP treatment is performed after the wirings are embedded in the insulating films, the insulating films need to have high mechanical strength. As long as their mechanical strength can be secured, the insulating films can be made porous to have a lower dielectric constant. The insulating films are formed by a sputtering method, a CVD method, a coating method including a spin coating method (also referred to as spin on glass (SOG)), or the like.

For each of the insulating films 611, 621, 625, 643, and 649, an insulating film which functions as an etching stopper when planarization treatment is performed by CMP or the like may be additionally provided after the wiring material is embedded in the insulating films.

A barrier film is formed over each of the wiring layers 617, 618, 619, 620, 626, 627, 628, 644, 645, 646, 647, 648, and 650 and a protective film is formed over the barrier film. The barrier film is provided in order to prevent diffusion of the wiring material such as copper. The barrier film can be formed using an insulating material such as silicon nitride, SiC, or SiBON. However, when the barrier film is thick, capacitance between wirings is increased; thus, a material having barrier properties and a low dielectric constant is preferably selected.

Each of the contact plugs 612, 613, 614, 615, 622, 623, 624, 630, 637, 638, 639, 640, 641, and 642 is formed in such a manner that an opening (via hole) with a high aspect ratio is formed in the insulating film and is filled with a conductive material such as tungsten. The opening is preferably formed by highly anisotropic dry etching. In particular, a reactive ion etching (RIE) method is preferably used. A barrier film (diffusion prevention film) which is a titanium film, a titanium nitride film, a stacked layer of them, or the like is formed on an inner wall of the opening and a material such as tungsten or polysilicon doped with phosphorus, or the like is embedded in the barrier film. For example, tungsten can be embedded in the barrier film by a blanket CVD method and the top surfaces of the contact plugs are planarized by CMP.

As illustrated in FIG. 10, the wiring layer 650 includes an upper wiring portion and a lower via hole portion. The lower via hole portion is connected to the wiring layers 646 and 648 in a lower layer. The wiring layers having this structure can be formed by what is called a dual damascene method or the like.

With the above-described structure in which the transistor including the first semiconductor material and being capable of operating at high speed and the transistor including the second semiconductor material and having extremely low off-state current are combined, a semiconductor device including a logic circuit capable of operating at high speed with low power consumption, e.g., a memory device or a central processing unit (CPU), can be manufactured.

Note that the structures, methods, and the like described in this embodiment can be used as appropriate in combination with any of the structures, methods, and the like described in the other embodiments.

Embodiment 4

In this embodiment, an example of a semiconductor device (memory device) which includes the transistor described in this specification, which can hold stored data even when not powered, and which has an unlimited number of write cycles will be described with reference to FIG. 9C.

Figure 9C:
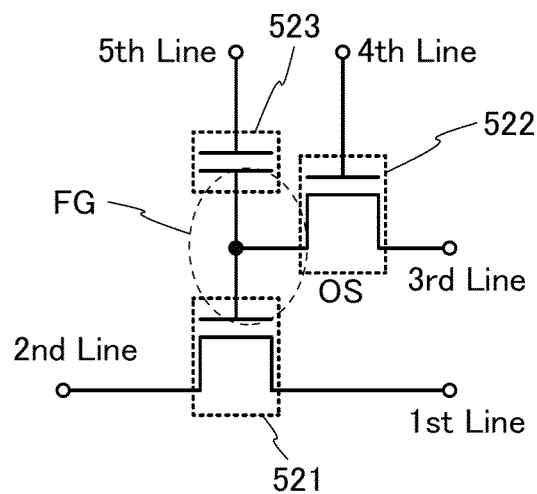

In FIG. 9C, a first wiring (1st Line) is electrically connected to a source electrode layer of the transistor 521. A second wiring (2nd Line) is electrically connected to a drain electrode layer of the transistor 521. A third wiring (3rd Line) is electrically connected to one of a source electrode layer and a drain electrode layer of the transistor 522, and a fourth wiring (4th Line) is electrically connected to a gate electrode layer of the transistor 522. A gate electrode layer of the transistor 521 and the other of the source electrode layer and the drain electrode layer of the transistor 522 are electrically connected to one electrode of a capacitor 523. A fifth wiring (5th line) is electrically connected to the other electrode of the capacitor 523.

Here, the transistor 521 is a transistor in which a first semiconductor material is used for a channel formation region and the transistor 522 is a transistor in which a second semiconductor material is used for a channel formation region.

The first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics. As described in the above embodiment, in the case where an oxide semiconductor is used as the second semiconductor material, it is preferable that the amount of oxygen vacancies in the oxide semiconductor film be sufficiently low.

The semiconductor device illustrated in FIG. 9C utilizes a characteristic in which the potential of the gate electrode layer of the transistor 521 can be held, and thus enables writing, holding, and reading of data as follows.

Writing and holding of data will be described. A potential of the fourth wiring is set to a potential at which the transistor 522 is turned on, so that the transistor 522 is turned on. Thus, the potential of the third wiring is applied to the gate electrode layer of the transistor 521 and the capacitor 523. That is, predetermined charge is supplied to the gate electrode layer of the transistor 521 (writing). Here, one of two kinds of charges providing different potentials (hereinafter referred to as a low-level charge and a high-level charge) is applied. After that, the potential of the fourth wiring is set to a potential at which the transistor 522 is turned off, so that the transistor 522 is turned off. Thus, the charge supplied to the gate electrode layer of the transistor 521 is held (holding).

Since the off-state current of the transistor 522 is extremely low, the charge of the gate electrode layer of the transistor 521 is held for a long time.

Next, reading of data is described. By supplying an appropriate potential (reading potential) to the fifth wiring while a predetermined potential (constant potential) is supplied to the first wiring, the potential of the second wiring varies depending on the amount of charge held in the gate electrode layer of the transistor 521. This is because in general, when the transistor 521 is an n-channel transistor, an apparent threshold voltage $V_{th\_H}$ in the case where the high-level charge is given to the gate electrode layer of the transistor 521 is lower than an apparent threshold voltage $V_{th\_L}$ in the case where the low-level charge is given to the gate electrode layer of the transistor 521. Here, an apparent threshold voltage refers to the potential of the fifth wiring, which is needed to turn on the transistor 521. Thus, the potential of the fifth wiring is set to a potential $V_0$ between $V_{th\_H}$ and $V_{th\_L}$, whereby charge supplied to the gate electrode layer of the transistor 521 can be determined. For example, in the case where the high-level charge is supplied in writing, when the potential of the fifth wiring is $V_0$ ($>V_{th\_H}$), the transistor 521 is turned on. In the case where the low-level charge is given in writing, even when the potential of the fifth wiring is set to $V_0$ ($<V_{th\_L}$), the transistor 521 remains in an off state. Therefore, the stored data can be read by the potential of the second wiring.

Note that in the case where memory cells are arrayed to be used, only data of desired memory cells needs to be read. In the case where such reading is not performed, a potential at which the transistor 521 is turned off regardless of the state of the gate electrode layer of the transistor 521, that is, a potential lower than $V_{th\_H}$ may be given to the fifth wiring. Alternatively, a potential at which the transistor 521 is turned on regardless of the state of the gate electrode layer, that is, a potential higher than $V_{th\_L}$ may be given to the fifth wiring.

The structures, methods, and the like described in this embodiment can be used as appropriate in combination with any of the structures, methods, and the like described in the other embodiments.

Embodiment 5

In this embodiment, a central processing unit (CPU) having the layered structure of transistors described in any of the above embodiments will be described as an example of a semiconductor device.

Figure 11A:
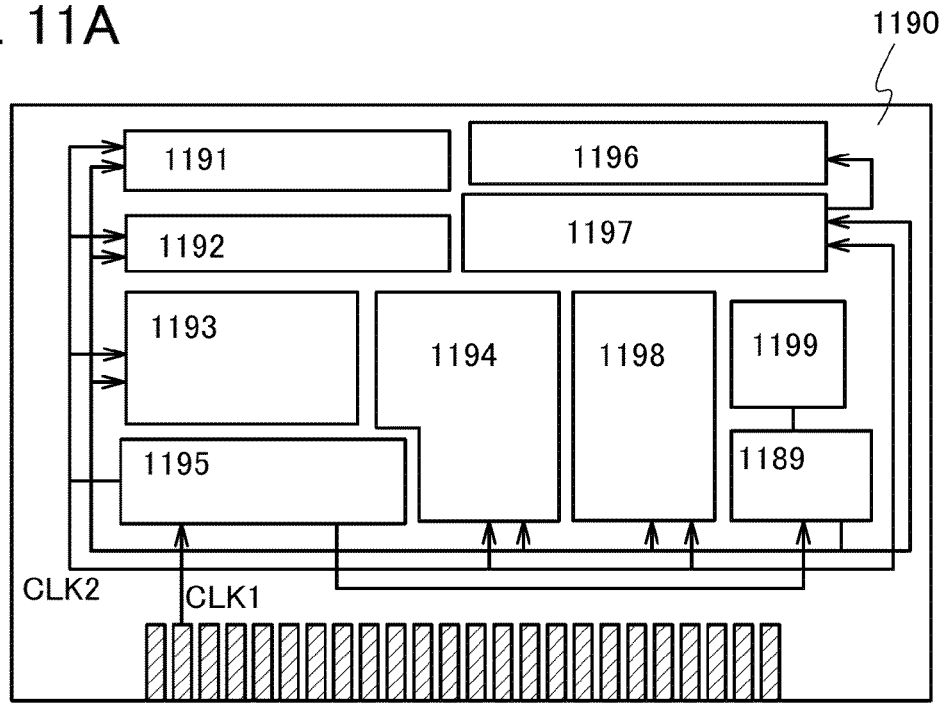
FIGS. 11A to 11C are block diagrams illustrating one embodiment of a semiconductor device.

FIG. 11A is a block diagram illustrating a specific structure of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 11A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 11A, a memory cell is provided in the register 1196. As the memory cell of the register 1196, the memory cell described in Embodiment 4 can be used.

In the CPU illustrated in FIG. 11A, the register controller 1197 selects operation of holding data in the register 1196 in accordance with an instruction from the ALU 1191. That is, the register controller 1197 selects whether data is held by a circuit element which inverts a logic level of a signal or a capacitor in the memory cell included in the register 1196. When data holding by the circuit element which inverts a logic level of a signal is selected, power supply voltage is supplied to the memory cell in the register 1196. When data holding by the capacitor is selected, the data is rewritten in the capacitor, and supply of power supply voltage to the memory cell in the register 1196 can be stopped.

Figure 11B:
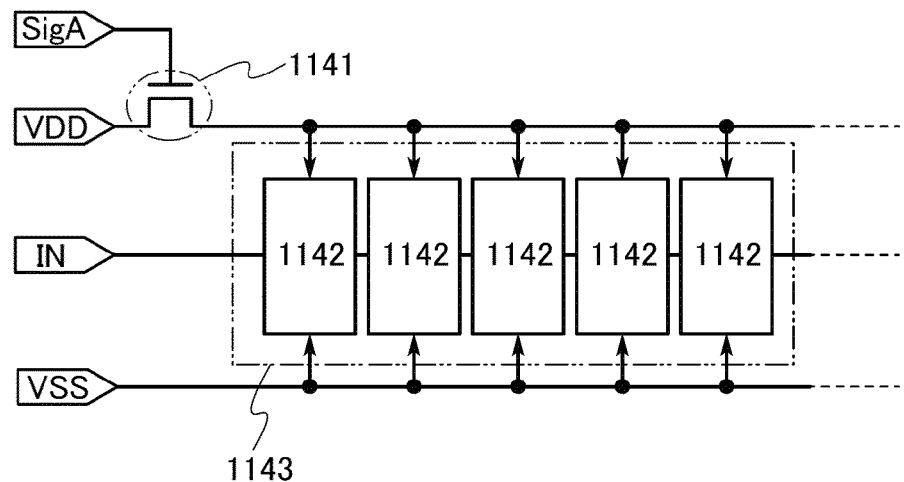
Figure 11C:
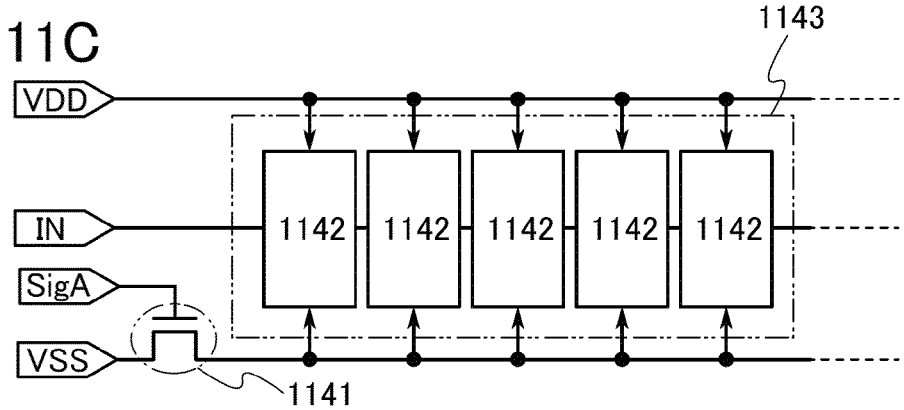

The power supply can be stopped by providing a switching element between a memory cell group and a node to which a power supply potential VDD or a power supply potential VSS is supplied, as illustrated in FIG. 11B or FIG. 11C. Circuits illustrated in FIGS. 11B and 11C are described below.

The memory device illustrated in FIG. 11B includes a switching element 1141 and a memory cell group 1143 including a plurality of memory cells 1142. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 11B, the switching of the switching element 1141 is controlled by a signal Sig A supplied to a gate electrode thereof.

Note that FIG. 11B illustrates the configuration in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 11B, the switching element 1141 may control the supply of the low-level power supply potential VSS.

In FIG. 11C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Further, Table 1 shows a comparison between a spin-MRAM (spin-transfer torque MRAM) which is known as a spintronics device and a memory including an oxide semiconductor.

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the power for overhead shown in Table 1 is, for example, power for writing data into a memory section or the like in a processor, which is what is called power consumed for overhead.

As described above, the use of the memory including an oxide semiconductor, which has more advantages than the spintronics device makes it possible to reduce power consumption of a CPU.

The methods and structures described in this embodiment can be combined as appropriate with any of the methods and structures described in the other embodiments.

Embodiment 6

Although the CPU is given as an example in Embodiment 5, the layered structure of transistors can also be applied to an LSI such as a digital signal processor (DSP), a custom LSI, or a field programmable gate array (FPGA). In this embodiment, a programmable logic device (PLD) typified by a FPGA having the layered structure of transistors is described.

The PLD is an integrated circuit whose structure can be decided (configuration) by a purchaser or a designer after manufacture and the design can be partly reconfigured after shipment. The PLD includes a plurality of logic blocks which are programmable logic components and reconfigurable wiring layers for connecting the logic blocks to each other. Therefore, a complex logic circuit can be formed by a combination of the plurality of logic blocks and can be reconfigured.

TABLE 1

|  | Spintronics (magnetic) | Oxide semiconductor/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/off of FET |
| 4) Si LSI | Suitable for bipolar LSI (MOS transistor is preferred in high integration circuit (Bipolar transistor is unsuitable for High Integration), W is large) | Suitable for MOS LSI |
| 5) Power for Overhead | High | Charge and discharge of parasitic capacitance |
|  | Joule heat is needed | Smaller by 2 or 3 or more orders of magnitude |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | 15 $F^2$ | Depending on the degree of 3D conversion |
| 10) Material | Magnetic Rare earth (strategic material) | Oxide semiconductor material |
| 11) Resistance to magnetic field | Low | High |

The logic block is formed using, for example, a look-up table (LUT) or the like. The look-up table performs arithmetic processing based on setting data on an input signal so that the input signal is used as an output signal. Here, the setting data is stored in storage circuits that correspond to the logic blocks. In other words, the look-up table can perform different arithmetic processing in accordance with the data stored in the storage circuits. Thus, the functions of the logic blocks can be specified when specific setting data is stored in the storage circuits.

The setting data or the like of the look-up table is referred to as configuration data. In addition, the storage circuits that correspond to the logic blocks and store the configuration data are referred to as configuration memories. Further, storage of the configuration data in the configuration memory is referred to as configuration. In particular, rewrite (refresh) of the configuration data stored in the configuration memory is referred to as reconfiguration. The circuit structure of the PLD can be changed into a circuit structure suitable for a user's request when desired configuration data is produced (programmed) and configuration is performed.

The PLD generally performs configuration (static configuration) under the condition that the operation of a semiconductor device including the PLD is stopped. In contrast, the PLD can perform configuration (dynamic configuration) when the semiconductor device operates in order to further exploit the features of the PLD.

The PLD can correct a bug or change design specification at the time of actual use; therefore, the developing time or the manufacturing time can be shortened and the manufacturing cost can be reduced.

Figure 15A:
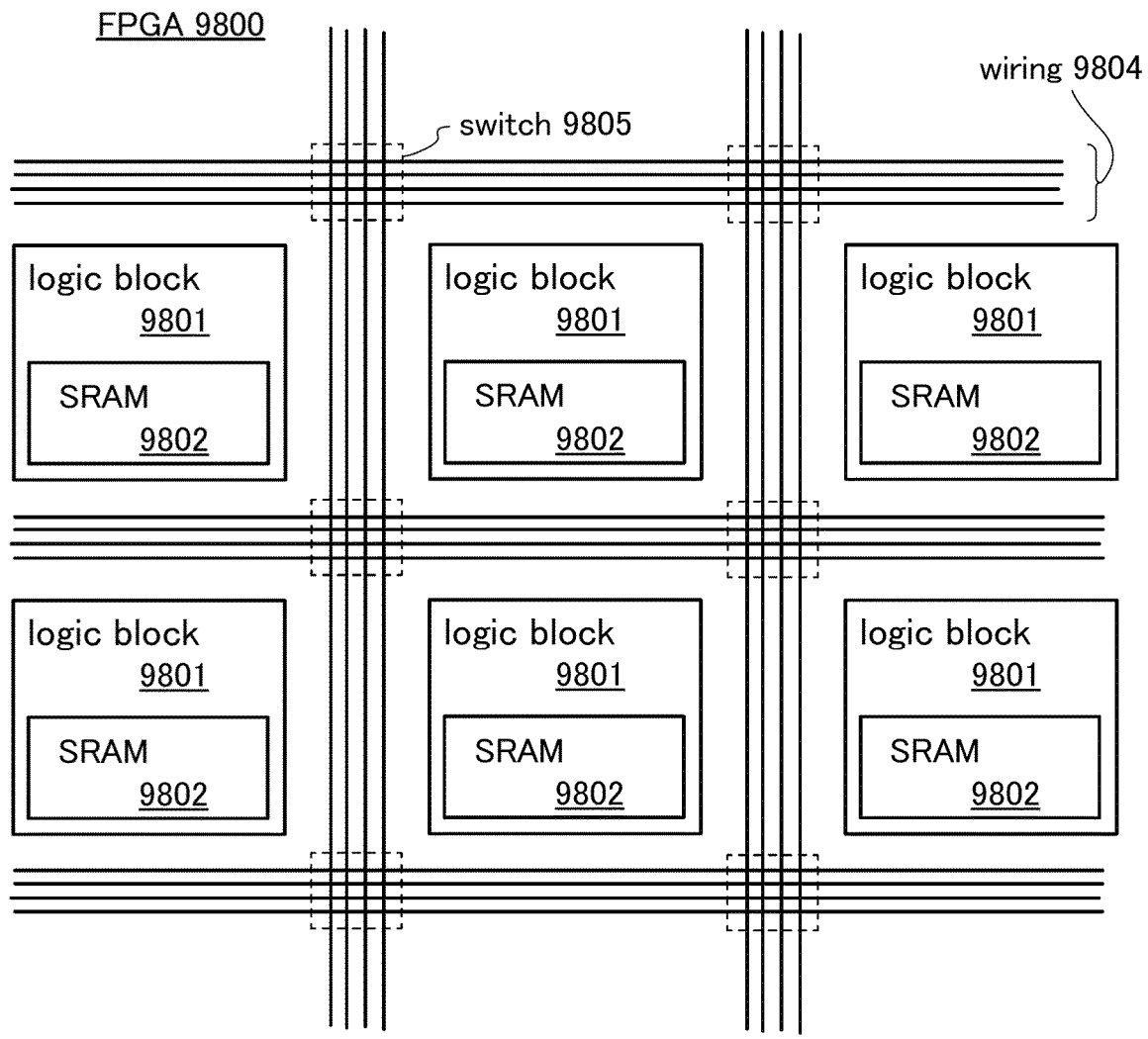
FIGS. 15A and 15B illustrate a conventional PLD.

As illustrated in FIG. 15A, a PLD 9800 that is a conventional PLD includes a plurality of logic blocks 9801 arranged in a grid form, a plurality of wirings 9804 provided between the plurality of logic blocks 9801 and extended vertically and horizontally, and a plurality of switches 9805 each provided at the intersection of the wirings 9804.

Figure 15B:
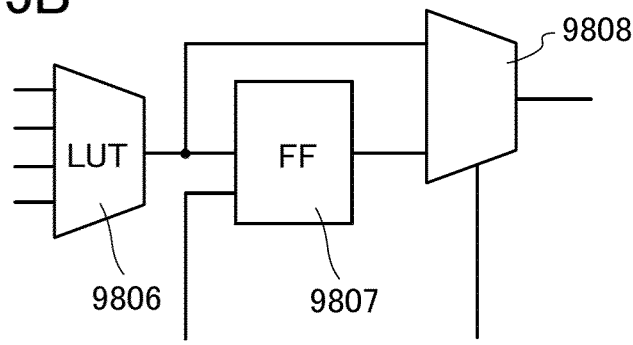

The logic block 9801 has a basic circuit, like a basic circuit with a structure illustrated in FIG. 15B. The look-up table (LUT) forming a logic of the PLD includes a SRAM 9802. The look-up table illustrated in FIG. 15B is an example of 4 input and 1 output and a given login circuit which obtains output of 1 bit from input of 4 bits can be formed. A flip-flop 9807 forms a sequential circuit and a selector 9808 switches between the sequential circuit operation and a combination circuit operation.

The switch 9805 is formed using a transfer gate (analog switch) or the like and the on/off of the switch is determined by the look-up table of the basic circuit in the logic block 9801; therefore, the logic block 9801 can be connected arbitrarily.

Here, the SRAM 9802 used for the look-up table is a volatile memory in which data is lost when the power of the PLD is turned off; therefore, in a conventional PLD, it is necessary to obtain the configuration data from the outside each time the power is turned on.

In view of the above, in this embodiment, instead of the SRAM 9802 used for the look-up table, a transistor using an oxide semiconductor film described in Embodiment 4 is included in the memory device.

As described in the above embodiment, with the use of an oxide semiconductor film in which oxygen vacancies are sufficiently reduced, a normally-off transistor can be obtained. Therefore, when the normally-off transistor is used instead of the SRAM of the PLD, a configuration memory can continue to retain configuration data for a long time even after supply of power supply voltage is stopped. Thus, after supply of power supply voltage is stopped, writing of configuration data to the configuration memory is not needed when power supply voltage is supplied again, so that the starting time of a PLD can be shortened. Consequently, in the PLD, supply of power supply voltage can be frequently stopped, and power consumption can be markedly reduced by normally off driving.

Further, in this embodiment, the layered structure of transistors manufactured by the manufacturing method described in Embodiment 2 is used for the PLD, whereby the PLD with a three-dimensionally stacked structure is realized.

In a conventional structure, as illustrated in FIG. 15A, the logic blocks are arranged two-dimensionally. Therefore, a region for forming a logic circuit or a wiring is limited and a function of capable of being formed in the logic block is limited. For this reason, in order to form a more developed logic circuit in the logic block, further miniaturization of an element, a wiring, or the like is required and thus cost is increased.

However, as described above, for example, when a transistor including an oxide semiconductor film is used instead of the SRAM used for the look-up table and the transistor is formed in the upper layer, as a result, an additional circuit configuration can be employed in a region of the lower layer.

Further, an electric circuit where arrangement in one plane is difficult is formed in a plurality of layers, whereby a circuit configuration of each layer is simplified, so that high integration can be achieved.

In particular, in the case where the layered structure of transistors according to the present invention is used for the PLD, it is preferable that the transistor including the first semiconductor material and being capable of operating at high speed and the transistor including the second semiconductor material and having extremely low off-state current be combined. For example, a transistor including an oxide semiconductor film is used as the transistor including the second semiconductor material and having extremely low off-state current. The transistor including an oxide semiconductor film is used in a high layer of two or more layers, whereby a highly integrated logic block can be formed.

Embodiment 7

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are shown in FIGS. 12A to 12C.

Figure 12A:
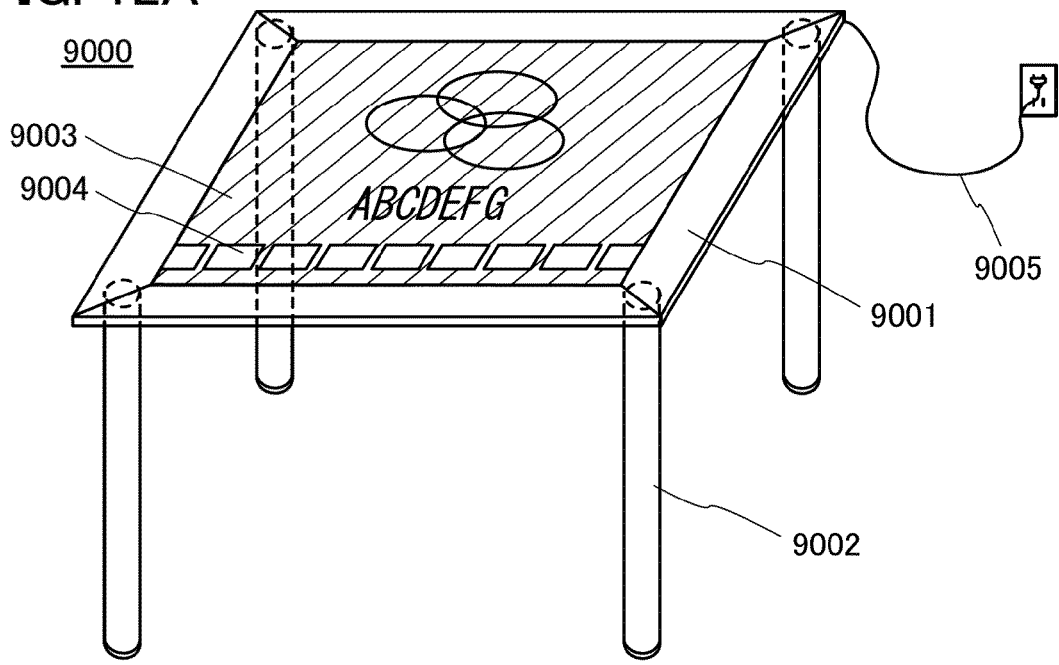
FIGS. 12A to 12C illustrate electronic appliances.
Figure 12B:
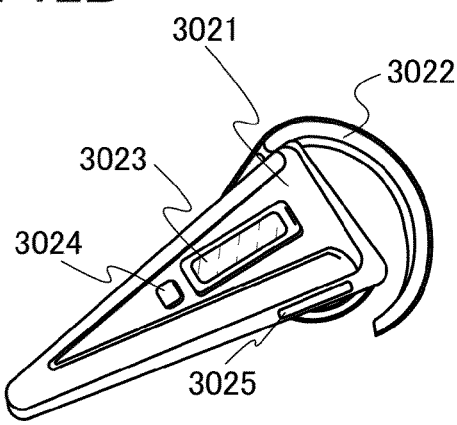
Figure 12C:
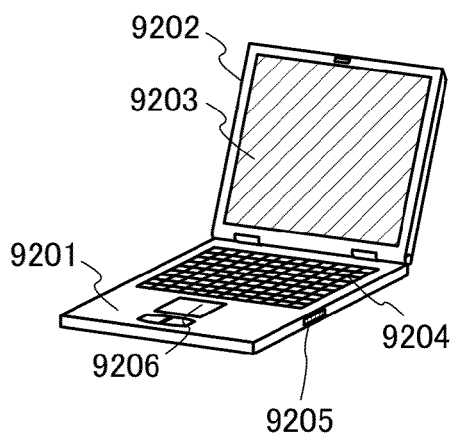

FIG. 12A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The layered structure of transistors described in Embodiment 1 can be used for a peripheral driver circuit for driving the display portion 9003, for example.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 12B illustrates a portable music player, which includes, in a main body 3021, a display portion 3023, a fixing portion 3022 with which the main body is worn on the ear, a speaker, an operation button 3024, an external memory slot 3025, and the like. The integrated circuit described in the above embodiment can be used for a memory, a CPU, or the like incorporated in the main body 3021.

Furthermore, when the portable music player illustrated in FIG. 12B has an antenna, a microphone function, or a wireless communication function and is used with a mobile phone, a user can talk on the phone wirelessly in a hands-free way while driving a car or the like.

FIG. 12C illustrates a computer which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention, for the CPU, for example.

Figure 13A:
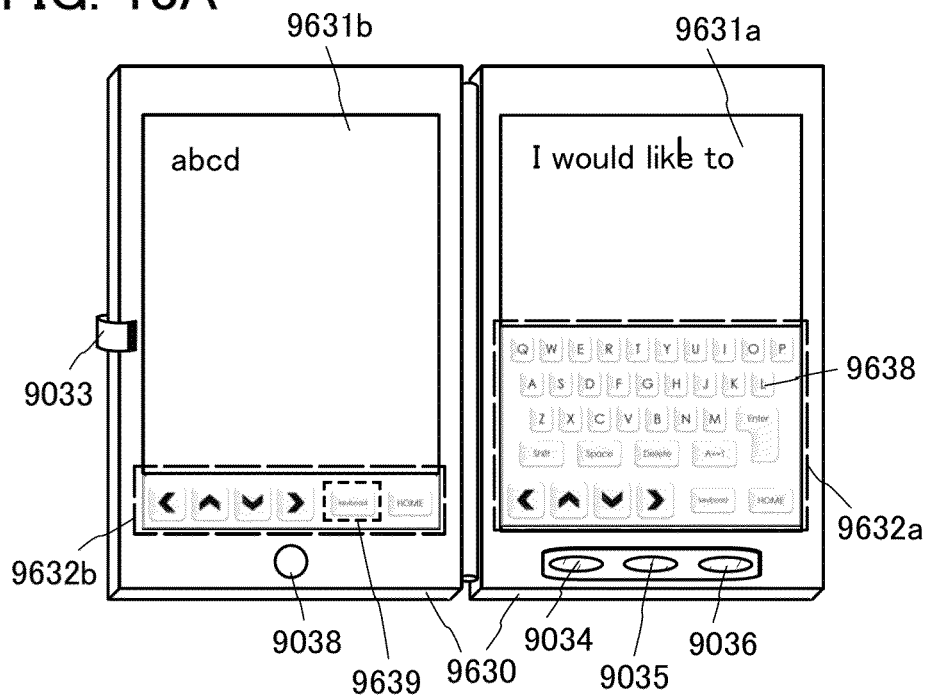
FIGS. 13A to 13C illustrate an electronic appliance.
Figure 13B:
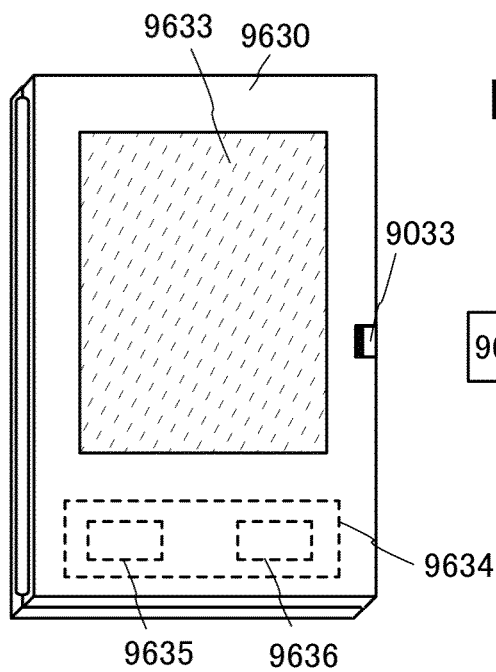

FIGS. 13A and 13B illustrate a tablet terminal that can be folded. In FIG. 13A, the tablet terminal is opened, and includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 13A and 13B, an SRAM or a DRAM is used as a memory for temporarily storing image data. For example, the memory can be manufactured using the layered structure of transistors described in the above embodiments.

A touch panel region 9632a can be provided in a part of the display portion 9631a, in which data can be input by touching displayed operation keys 9638. Note that FIG. 13A shows, as an example, that half of the area of the display portion 9631a has only a display function and the other half of the area has a touch panel function. However, one embodiment of the present invention is not limited to this structure, and the whole display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 13A, one embodiment of the present invention is not limited to this example. The display portion 9631a and the display portion 9631b may have different areas or different display quality. For example, one of them may be a display panel that can display higher-definition images than the other.

The tablet terminal is closed in FIG. 13B. The tablet terminal includes the housing 9630, a solar battery 9633, a charge/discharge control circuit 9634, a battery 9635, and a DCDC converter 9636. Note that in FIG. 13B, a structure including a battery 9635 and a DCDC converter 9636 is illustrated as an example of the charge/discharge control circuit 9634.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 13A and 13B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium secondary battery as the battery 9635 is advantageous in downsizing or the like.

Figure 13C:
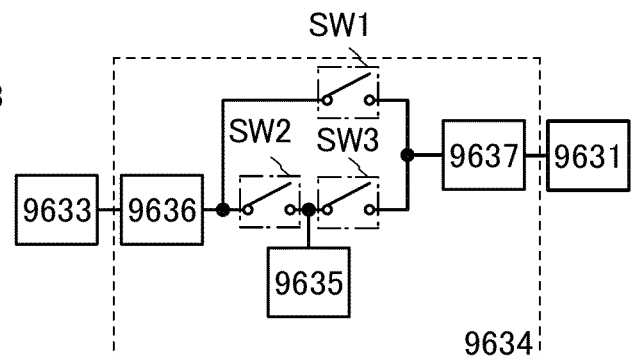

The structure and the operation of the charge/discharge control circuit 9634 illustrated in FIG. 13B are described with reference to a block diagram in FIG. 13C. The solar battery 9633, the battery 9635, the DCDC converter 9636, a converter 9637, switches SW1 to SW3, and the display portion 9631 are shown in FIG. 13C, and the battery 9635, the DCDC converter 9636, the converter 9637, and the switches SW1 to SW3 correspond to the charge/discharge control circuit 9634 in FIG. 13B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. When images are not displayed on the display portion 9631, the switch SW1 is turned off and the switch SW2 is turned on so that the battery 9635 is charged.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 14A:
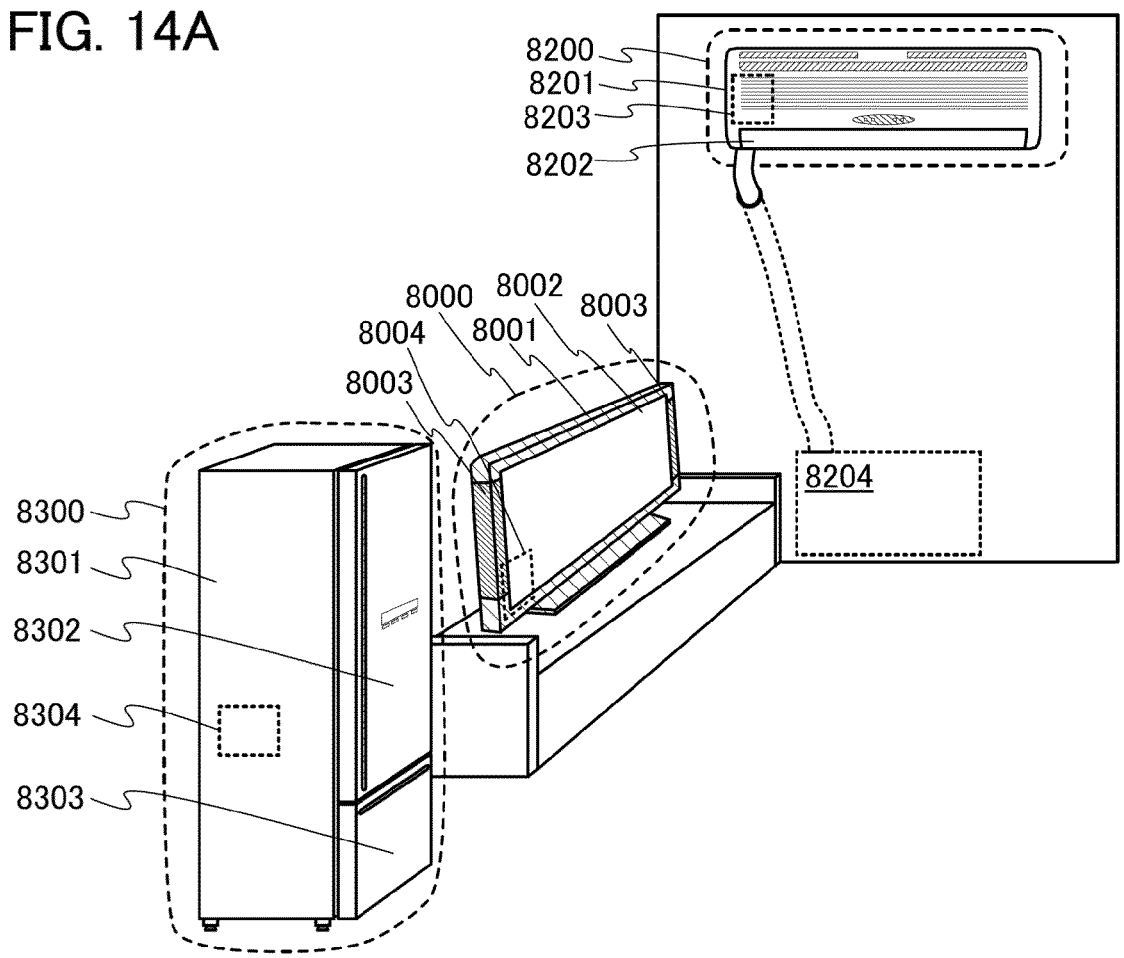
FIGS. 14A to 14C illustrate electronic appliances.

In a television device 8000 in FIG. 14A, a display portion 8002 is incorporated in a housing 8001. The display portion 8002 displays an image and a speaker portion 8003 can output sound. An integrated circuit having the layered structure of transistors described in Embodiment 1 can be used for a CPU or a memory for performing data communication.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television device 8000 may be provided with a receiver, a modem, and the like. In the television device 8000, with the receiver, general television broadcasting can be received. Furthermore, when the television device 8000 is connected to a communication network by wired or wireless connection via the modem, one-way (from a transmitter to a receiver) or two-way (between a transmitter and a receiver, between receivers, or the like) data communication can be performed.

In FIG. 14A, an air conditioner which includes an indoor unit 8200 and an outdoor unit 8204 is an example of an electronic appliance in which the CPU of Embodiment 4 is used. Specifically, the indoor unit 8200 includes a housing 8201, an air outlet 8202, a CPU 8203, and the like. Although the CPU 8203 is provided in the indoor unit 8200 in FIG. 14A, the CPU 8203 may be provided in the outdoor unit 8204. Alternatively, the CPU 8203 may be provided in both the indoor unit 8200 and the outdoor unit 8204. Since the CPU described in the above embodiment is formed using an oxide semiconductor, an air conditioner which has excellent heat resistance property and high reliability can be provided with the use of the CPU.

In FIG. 14A, an electric refrigerator-freezer 8300 is an example of an electrical appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 14A, the CPU 8304 is provided in the housing 8301.

Figure 14B:
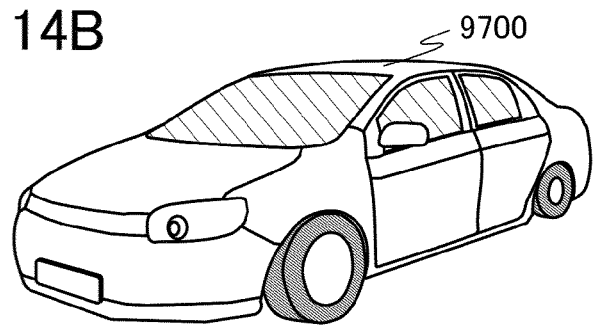
Figure 14C:
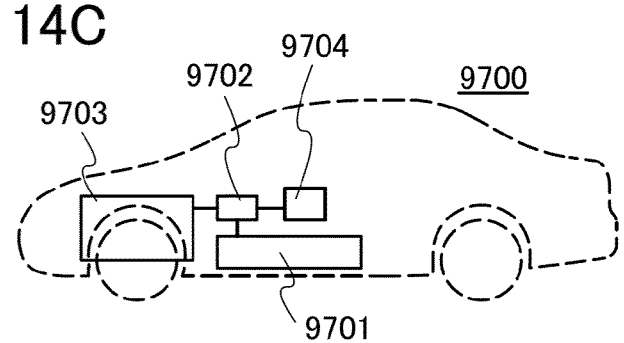

FIGS. 14B and 14C illustrate an example of an electric vehicle which is an example of an electric vehicle. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. The CPU described in the above embodiment can be used as a CPU in the electric vehicle 9700.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The methods and structures described in this embodiment can be combined as appropriate with any of the methods and structures described in the other embodiments.

This application is based on Japanese Patent Application serial no. 2012-099653 filed with Japan Patent Office on Apr. 25, 2012, the entire contents of which are hereby incorporated by reference.

What is claimed is:

1. A method for manufacturing a semiconductor device, comprising:
    forming a first oxide semiconductor film including a first channel formation region;
    performing first oxygen supplying treatment on the first oxide semiconductor film;
    forming an insulating film over the first oxide semiconductor film;
    forming a second oxide semiconductor film including a second channel formation region over the insulating film;
    forming an opening in part of the insulating film so that the first channel formation region is exposed; and
    performing second oxygen supplying treatment on the second oxide semiconductor film and the first channel formation region of the first oxide semiconductor film.

2. The method for manufacturing a semiconductor device according to claim 1, wherein the second channel formation region is formed so as not to overlap with the first channel formation region.

3. The method for manufacturing a semiconductor device according to claim 1, wherein the first oxygen supplying treatment is oxygen doping treatment or a combination of oxygen doping treatment and oxygen annealing treatment.

4. The method for manufacturing a semiconductor device according to claim 1, wherein the second oxygen supplying treatment is oxygen doping treatment or a combination of oxygen doping treatment and oxygen annealing treatment.

5. The method for manufacturing a semiconductor device according to claim 3, wherein the oxygen doping treatment is performed by an ion implantation method.

6. The method for manufacturing a semiconductor device according to claim 4, wherein the oxygen doping treatment is performed by an ion implantation method.

7. The method for manufacturing a semiconductor device according to claim 1, further comprising a step of performing planarization treatment on a surface of the insulating film.

8. A method for manufacturing a semiconductor device, comprising:
   forming a first oxide semiconductor film including a first channel formation region;
   performing first oxygen supplying treatment on the first oxide semiconductor film;
   forming an insulating film over the first oxide semiconductor film;
   forming a second oxide semiconductor film including a second channel formation region over the insulating film;
   forming an opening in part of the insulating film so that the first channel formation region is exposed;
   performing second oxygen supplying treatment on the second oxide semiconductor film and the first channel formation region of the first oxide semiconductor film;
   forming a gate insulating film over the second oxide semiconductor film; and
   forming a gate electrode over the gate insulating film.

9. The method for manufacturing a semiconductor device according to claim 8, wherein the second channel formation region is formed so as not to overlap with the first channel formation region.

10. The method for manufacturing a semiconductor device according to claim 8, wherein the first oxygen supplying treatment is oxygen doping treatment or a combination of oxygen doping treatment and oxygen annealing treatment.

11. The method for manufacturing a semiconductor device according to claim 8, wherein the second oxygen supplying treatment is oxygen doping treatment or a combination of oxygen doping treatment and oxygen annealing treatment.

12. The method for manufacturing a semiconductor device according to claim 10, wherein the oxygen doping treatment is performed by an ion implantation method.

13. The method for manufacturing a semiconductor device according to claim 11, wherein the oxygen doping treatment is performed by an ion implantation method.

14. The method for manufacturing a semiconductor device according to claim 8, further comprising a step of performing planarization treatment on a surface of the insulating film.

15. A method for manufacturing a semiconductor device, comprising:
   forming a first oxide semiconductor film including a first channel formation region;
   performing first oxygen supplying treatment on the first oxide semiconductor film;
   forming an insulating film over the first oxide semiconductor film;
   forming a gate electrode over the insulating film;
   forming a gate insulating film over the gate electrode;
   forming a second oxide semiconductor film including a second channel formation region over the gate insulating film;
   forming an opening in part of the insulating film and the gate insulating film so that the first channel formation region is exposed; and
   performing second oxygen supplying treatment on the second oxide semiconductor film and the first channel formation region of the first oxide semiconductor film.

16. The method for manufacturing a semiconductor device according to claim 15, wherein the second channel formation region is formed so as not to overlap with the first channel formation region.

17. The method for manufacturing a semiconductor device according to claim 15, wherein the first oxygen supplying treatment is oxygen doping treatment or a combination of oxygen doping treatment and oxygen annealing treatment.

18. The method for manufacturing a semiconductor device according to claim 15, wherein the second oxygen supplying treatment is oxygen doping treatment or a combination of oxygen doping treatment and oxygen annealing treatment.

19. The method for manufacturing a semiconductor device according to claim 17, wherein the oxygen doping treatment is performed by an ion implantation method.

20. The method for manufacturing a semiconductor device according to claim 18, wherein the oxygen doping treatment is performed by an ion implantation method.

21. The method for manufacturing a semiconductor device according to claim 15, further comprising a step of performing planarization treatment on a surface of the insulating film.

* * * * *